US012572073B2

(12) United States Patent
Chavez et al.

(10) Patent No.: US 12,572,073 B2
(45) Date of Patent: Mar. 10, 2026

(54) PHOTORESIST UNDERLAYER COMPOSITION

(71) Applicant: Rohm and Haas Electronic Materials LLC, Marlborough, MA (US)

(72) Inventors: Anton Chavez, West Newton, MA (US); Iou-Sheng Ke, Andover, MA (US); Shintaro Yamada, Shrewsbury, MA (US)

(73) Assignee: DUPONT ELECTRONIC MATERIALS INTERNATIONAL, LLC, Marlborough, MA (US)

( * ) Notice: Subject to any disclaimer, the term of this patent is extended or adjusted under 35 U.S.C. 154(b) by 646 days.

(21) Appl. No.: 17/946,428

(22) Filed: Sep. 16, 2022

(65) Prior Publication Data

US 2024/0126172 A1 Apr. 18, 2024

(51) Int. Cl.

*G03F 7/09* (2006.01)
*G03F 7/039* (2006.01)
*G03F 7/16* (2006.01)
*G03F 7/32* (2006.01)

(52) U.S. Cl.

CPC ............ *G03F 7/094* (2013.01); *G03F 7/0392* (2013.01); *G03F 7/162* (2013.01); *G03F 7/168* (2013.01); *G03F 7/322* (2013.01)

(58) Field of Classification Search

None
See application file for complete search history.

(56) References Cited

U.S. PATENT DOCUMENTS

2001/0055727 A1* 12/2001 Kubota ................. G03F 7/0048 430/326
2003/0039916 A1* 2/2003 Adegawa .............. G03F 7/0045 430/921
2003/0059552 A1* 3/2003 Yasunami ............. G03F 7/0758 427/407.1
2011/0053091 A1* 3/2011 Hiroi .................... C08G 59/186 252/582
2017/0038687 A1 2/2017 Hiroto et al.
2020/0333709 A1 10/2020 Kori et al.
2020/0381247 A1 12/2020 Kori et al.
2021/0063881 A1 3/2021 Endo et al.

FOREIGN PATENT DOCUMENTS

JP 2005272483 A 10/2005
JP 2007039486 A 2/2007
JP 2010195880 A 9/2010
WO WO-2008038131 A1 * 4/2008 ............... G03F 7/20
WO 2017187279 A1 11/2017
WO 2020194612 A1 10/2020

OTHER PUBLICATIONS

Sanrame, C.N., Brandao, M.S.B., Coenjarts, C., Scaiano, J.C., Pohlers, G., Suzuki, Y., Cameron, J.F.—Mechanism of photoacid generation for an arylcycloalkylsulfonium salt by ring opening and aryl cleavage, Photochem. Photobiol. Sci., 2004, 3, pp. 1052-1057 (Year: 2004).*
Horibe, H., Kumada, T., Fujino, T., Kimura, Y., Kubota, S.—Development of the chemically amplified three-component positive electron beam resist, Kobunshi Ronbunshu, vol. 55, No. 5, pp. 231-242, May 1998 (Year: 1998).*
Trejo-Machin, et al., "A cardanol-based polybenzoxazine vitrimer: recycling, reshaping and reversible adhesion" Polym. Chem., 2020, 11, (pp. 7026-7034).

* cited by examiner

*Primary Examiner* — Anca Eoff
(74) *Attorney, Agent, or Firm* — CANTOR COLBURN LLP

(57) ABSTRACT

A method of forming a pattern, the method comprising: providing a photoresist underlayer over a substrate; forming a photoresist layer over the photoresist underlayer; patterning the photoresist layer; and transferring a pattern from the patterned photoresist layer to the photoresist underlayer;

wherein the photoresist underlayer is formed from a composition comprising a solvent and a compound represented by Formula 1

Formula 1

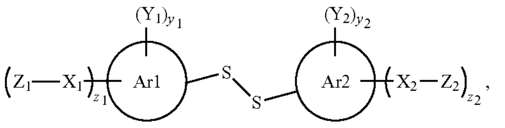

or a polymer having a repeating unit represented by Formula 2

Formula 2

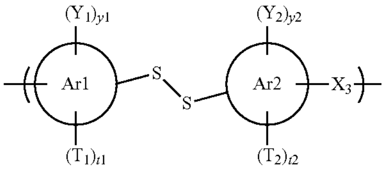

;

wherein in Formulae 1 and 2:

Ar1 and Ar2 independently represent an aromatic group; and $Y_1$, $Y_2$, $X_1$, $X_2$, $X_3$, $T_1$, $T_2$, $Z_1$, and $Z_2$ are as defined.

10 Claims, No Drawings

PHOTORESIST UNDERLAYER COMPOSITION

FIELD

The present invention relates to a manufacturing of electronic devices, and more specifically, to materials and compositions for use in semiconductor manufacture.

BACKGROUND

The ongoing miniaturization of integrated circuit feature sizes requires the use of thin photoresist films for good pattern imaging. However, thin photoresist films often do not have the etch resistance to survive pattern transfer to the substrate. To address this issue the semiconductor industry has turned the use of multilayer lithographic schemes where the resist image is transferred to a much more robust carbon hardmask underlayer. A typical trilayer scheme consists of a carbon hard mask, a silicon based antireflective coating (SiARC) and the photo-imageable photoresist.

The pattern in the photoresist is first transferred to the SiARC then to the hardmask and finally into the desired substrate. One of the key criteria of the hardmask is to have sufficient etch resistance to whatever etch condition is used to enable successful pattern transfer. One method of producing a carbon hardmask is through chemical vapor deposition (CVD). Although this method produces a highly etch resistant film, there are multiple drawbacks such as being a relatively slow (inefficient) and expensive process. Therefore, development of a solution processable "spin on carbon" (SOC) hardmask is highly desirable.

Spin-on Carbon (SOC) compositions are often used to form resist underlayer films in the semiconductor industry, which are used as etch masks for lithography in advanced technology nodes for integrated circuit manufacturing. An ideal SOC material should possess certain specific characteristics: should be capable of being cast onto a substrate by a spin-coating process; should be thermally set upon heating with low out-gassing and sublimation; should be soluble in common solvents for good spin bowl compatibility; should have appropriate n/k to work in conjunction with the antireflective coating layer to impart low reflectivity necessary for photoresist imaging; should be sufficiently adhered to a lower layer, e.g., a substrate, to avoid delamination when submerged during a standard cleaning process, for example, a SC-1 process using a hydrogen peroxide/ammonium hydroxide bath; and/or should have high thermal stability to avoid damage during subsequent processing steps. In addition, a SOC material should possess material flow ability (referred to as planarization, PL) on complicated topography design in advanced node.

Accordingly, there remains a need for advanced photoresist underlayer films/materials that exhibit many of the properties above including acceptable adhesion to an underlying layer/substrate and acceptable planarization to meet the ever increasing design requirements in semiconductor manufacturing.

SUMMARY

Provided is a method of forming a pattern, the method comprising:

providing a photoresist underlayer over a substrate;

forming a photoresist layer over the photoresist underlayer;

patterning the photoresist layer; and transferring a pattern from the patterned photoresist layer to the photoresist underlayer;

wherein the photoresist underlayer is formed from a composition comprising a solvent and a compound represented by Formula 1

Formula 1

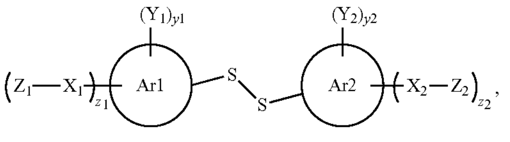

or a polymer having a repeating unit represented by Formula 2

Formula 2

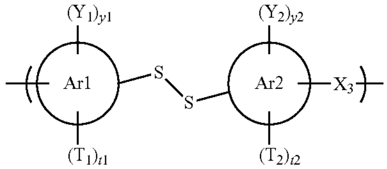

;

wherein in Formulae 1 and 2:

Ar1 and Ar2 independently represent an aromatic group;

each $Y_1$ and each $Y_2$ are independently —OH, —SH, —C(O)OH, —$NH_2$, —$R^A$, —$OR^A$, —C(O)$OR^A$, —$SR^A$, or —$NHR^A$, and $y_1$ and $y_2$ are independently an integer from 0 to 6, $X_1$ and $X_2$ are independently a single bond or a divalent linker;

$X_3$ is a divalent linker;

$Z_1$ and $Z_2$ are independently —$OR^A$, —C(O)$OR^A$, —$SR^A$, —$NHR^A$, —OC(O)$CR^B$═$CH_2$, a substituted or unsubstituted $C_{1-18}$ alkyl group, a substituted or unsubstituted $C_{1-18}$ alkoxy group, a substituted or unsubstituted $C_{3-12}$ cycloalkyl group, a substituted or unsubstituted $C_{3-12}$ heterocycloalkyl group, a substituted or unsubstituted $C_{3-12}$ glycidyl group, a substituted or unsubstituted $C_{2-18}$ alkenyl group, a substituted or unsubstituted $C_{5-12}$ cycloalkenyl group, a substituted or unsubstituted $C_{3-18}$ alkynyl group, a substituted or unsubstituted $C_{6-14}$ aryl group, or a substituted or unsubstituted $C_{3-44}$ heteroaryl, $R^A$ is independently a substituted or unsubstituted $C_1$-$C_{18}$ alkyl, a substituted or unsubstituted $C_3$-$C_{12}$ cycloalkyl, a substituted or unsubstituted $C_3$-$C_{12}$ heterocycloalkyl, a substituted or unsubstituted $C_{2-18}$ alkenyl, a substituted or unsubstituted $C_{3-8}$ alkyne, a substituted or unsubstituted $C_6$-$C_{14}$ aryl, or a substituted or unsubstituted $C_6$-$C_{14}$ heteroaryl;

$R^B$ is hydrogen, fluorine, or a substituted or unsubstituted $C_{1-5}$ alkyl;

$T_1$ and $T_2$ are independently a divalent linker;

$z_1$ and $z_2$ are independently an integer from 0 to 6, or an integer from 0 to 3, and for the compound of Formula 1, $z_1+y_1$ is at least 1, and $z_2+y_2$ is at least 1; and $t_1$ and $t_2$ are independently an integer from 0 to 6, or an integer from 0 to 3.

Also provided is the photoresist underlayer composition above.

Also provided is a substrate including a layer of the above-described photoresist underlayer composition disposed on a substrate; and a photoresist layer disposed on the layer of the photoresist underlayer composition.

DETAILED DESCRIPTION

Reference will now be made in detail to exemplary embodiments, examples of which are illustrated in the present description. In this regard, the present exemplary embodiments may have different forms and should not be construed as being limited to the descriptions set forth herein. Accordingly, the exemplary embodiments are merely described below, by referring to the figures, to explain aspects of the present description. As used herein, the term "and/or" includes all combinations of one or more of the associated listed items. Expressions such as "at least one of," when preceding a list of elements, modify the entire list of elements and do not modify the individual elements of the list.

As used herein, the terms "a," "an," and "the" do not denote a limitation of quantity and are to be construed to cover both the singular and the plural, unless otherwise indicated herein or clearly contradicted by context. "Or" means "and/or" unless clearly indicated otherwise. All ranges disclosed herein are inclusive of the endpoints, and the endpoints are independently combinable with each other. The suffix "(s)" is intended to include both the singular and the plural of the term that it modifies, thereby including at least one of that term. "Optional" or "optionally" means that the subsequently described event or circumstance can or cannot occur, and that the description includes instances where the event occurs and instances where it does not. The terms "first," "second," and the like, herein do not denote an order, quantity, or importance, but rather are used to distinguish one element from another. When an element is referred to as being "on" another element, it may be directly in contact with the other element or intervening elements may be present therebetween. In contrast, when an element is referred to as being "directly on" another element, there are no intervening elements present. It is to be understood that the described components, elements, limitations, and/or features of aspects may be combined in any suitable manner in the various aspects.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, the term "hydrocarbon" refers to an organic compound, or an organic group, having at least one carbon atom and at least one hydrogen atom, optionally includes an aromatic group and/or one or more heteroatoms, and is optionally substituted with one or more substituents where indicated; "alkyl group" refers to a straight or branched chain saturated hydrocarbon having the specified number of carbon atoms and having a valence of one; "alkylene group" refers to an alkyl group having a valence of two; "hydroxyalkyl group" refers to an alkyl group substituted with at least one hydroxyl group (—OH); "alkoxy group" refers to "alkyl-O—"; "carboxylic acid group" refers to a group having the formula "—C(═O)—OH"; "cycloalkyl group" refers to a monovalent group having one or more saturated rings in which all ring members are carbon; "cycloalkylene group" refers to a cycloalkyl group having a valence of two; "alkenyl group" refers to a straight or branched chain, monovalent hydrocarbon group having at least one carbon-carbon double bond; "alkenoxy group" refers to "alkenyl-O—"; "alkenylene group" refers to an alkenyl group having a valence of at least two; "cycloalkenyl group" refers to a cycloalkyl group having at least one carbon-carbon double bond; "alkynyl group" refers to a monovalent hydrocarbon group having at least one carbon-carbon triple bond.

As used herein, the term "aromatic group" denotes the conventional idea of aromaticity as defined in the literature, in particular in IUPAC 19, and refers to a monocyclic or polycyclic aromatic ring or ring system that includes carbon atoms in the ring or rings, and optionally may include one or more heteroatoms independently selected from N, O, and S instead of a carbon atom or carbon atoms in the ring or rings. Exemplary aromatic groups can include an aromatic ring system with one to six independently substituted or unsubstituted aromatic rings. If the aromatic group includes two to six aromatic rings, then two or more aromatic rings can be connected by a single bond or a divalent linker, or two or more of the aromatic rings can be fused aromatic rings. A polycyclic aromatic ring system includes at least one ring being an aromatic hydrocarbyl group, e.g., the other rings can be a cycloalkyl, a cycloalkenyl, an aryl, a heterocycle, and/or a heteroaryl. Preferred aromatic groups are those containing six to thirty carbon atoms, six to twenty carbon atoms, or six to twelve carbon atoms. Exemplary aromatic groups include phenyl, biphenyl, triphenyl, triphenylene, tetraphenylene, naphthalene, anthracene, phenalene, phenanthrene, fluorene, pyrene, chrysene, perylene, and azulene. Exemplary aromatic groups that include one or more heteroatoms include dibenzothiophene, dibenzofuran, furan, thiophene, benzofuran, benzothiophene, carbazole, indolocarbazole, pyridylindole, pyrazole, imidazole, triazole, pyridine, pyridazine, pyrimidine, pyrazine, triazine, indole, benzimidazole, quinoline, isoquinoline, cinnoline, quinazoline, quinoxaline, or xanthene.

As used herein, the term "aryl group" refers to a monovalent, monocyclic or polycyclic aromatic group containing only carbon atoms in the aromatic ring or rings, and may include a group with an aromatic ring fused to at least one cycloalkyl or heterocycloalkyl ring; "arylene group" refers to an aryl group having a valence of at least two; "alkylaryl group" refers to an aryl group that has been substituted with an alkyl group; "arylalkyl group" refers to an alkyl group that has been substituted with an aryl group; "aryloxy group" refers to "aryl-O—"; and "arylthio group" refers to "aryl-S—".

The prefix "hetero" means that the compound or group includes at least one member that is a heteroatom (e.g., 1, 2, 3, or 4 or more heteroatom(s)) instead of a carbon atom, wherein the heteroatom(s) is each independently selected from N, O, S, Si, or P; "heteroatom-containing group" refers to a substituent group that includes at least one heteroatom; "heteroalkyl group" refers to an alkyl group having 1-4 heteroatoms instead of carbon atoms; "heterocycloalkyl group" refers to a cycloalkyl group with one or more N, O or S atoms instead of carbon atoms; "heterocycloalkylene group" refers to a heterocycloalkyl group having a valence of at least two; "heteroaryl group" refers to an aryl group having 1 to 3 separate or fused rings with one or more N, O or S atoms as ring members instead of carbon atoms; and "heteroarylene group" refers to a heteroaryl group having a valence of at least two.

The symbol "*" represents a bonding site (i.e., point of attachment).

"Substituted" or "substituent group" means that at least one hydrogen atom on the group is replaced with another group, provided that the designated atom's normal valence is not exceeded. When the substituent is oxo (i.e., =O), then two hydrogens on the carbon atom are replaced. Combinations of two or more substituents or variables are permissible. For example, the term "substituted" may refer to the stated hydrocarbon moiety with two, three, or four of the same or different substituent groups. Exemplary groups that may be present on a "substituted" position include, but are not limited to, nitro ($-NO_2$), cyano (—CN), hydroxyl (—OH), oxo (=O), amino ($-NH_2$), mono- or di-($C_{1-6}$) alkylamino, alkanoyl (such as a $C_{2-6}$ alkanoyl group such as acyl), formyl (—C(=O)H), carboxylic acid or an alkali metal or ammonium salt thereof, $C_{2-6}$ alkyl ester (—C(=O)O-alkyl or —OC(=O)-alkyl), $C_{7-13}$ aryl ester (—C(=O)O-aryl or —OC(=O)-aryl), amido ($-C(=O)NR_2$ wherein R is hydrogen or $C_{1-6}$ alkyl), carboxamido ($-CH_2C(=O)NR_2$ wherein R is hydrogen or $C_{1-6}$ alkyl), halogen, thiol (—SH), $C_{1-6}$ alkylthio (—S-alkyl), thiocyano (—SCN), $C_{1-6}$ alkyl, $C_{2-6}$ alkenyl, $C_{2-6}$ alkynyl, $C_{1-6}$ haloalkyl, $C_{1-9}$ alkoxy, $C_{1-6}$ haloalkoxy, $C_{3-12}$ cycloalkyl, $C_{5-18}$ cycloalkenyl, $C_{6-12}$ aryl having at least one aromatic ring (e.g., phenyl, biphenyl, naphthyl, or the like, each ring either substituted or unsubstituted aromatic), $C_{7-19}$ arylalkyl having 1 to 3 separate or fused rings and from 6 to 18 ring carbon atoms, arylalkoxy having 1 to 3 separate or fused rings and from 6 to 18 ring carbon atoms, $C_{7-12}$ alkylaryl, $C_{4-12}$ heterocycloalkyl, $C_{3-12}$ heteroaryl, $C_{1-6}$ alkyl sulfonyl ($-S(=O)_2$-alkyl), $C_{6-12}$ arylsulfonyl ($-S(=O)_2$-aryl), or tosyl ($CH_3C_6H_4SO_2-$). When a group is substituted, the indicated number of carbon atoms is the total number of carbon atoms in the group, excluding those of any substituents. For example, the group $-CH_2CH_2CN$ is a $C_2$ alkyl group substituted with a cyano group.

As used herein, the terms "polymer" and "polymeric" refer to a polymeric material that includes one or more repeating units, where the repeating units may be the same or different from each other. Thus, the disclosed polymers and polymeric materials of the invention can be referred to herein as a "polymer" or a "copolymer." It is to be further understand that the terms "polymer" and "polymeric" further include oligomers. As used herein, each of the one or more different repeating units are present in the polymeric material at least two times. In other words, a polymeric material including one repeating unit includes a first repeating unit that is present in an amount of two or more, and, for example, a polymeric material including at least two different repeating units, e.g., a first repeating unit, and a second repeating unit, with each of the first and the second repeating units present in an amount of two or more.

As used herein, when a definition is not otherwise provided, a "divalent linker" refers to a divalent group including one or more of —O—, —S—, —Te—, —Se—, —C(O)—, $-N(R^N)-$, $-C(O)NR^N-$, —S(O)—, $-S(O)_2-$, —C(S)—, —C(Te)—, —C(Se)—, substituted or unsubstituted $C_{1-30}$ alkylene, substituted or unsubstituted $C_{3-30}$ cycloalkylene, substituted or unsubstituted $C_{1-30}$ heterocycloalkylene, substituted or unsubstituted $C_{6-30}$ arylene, substituted or unsubstituted $C_{7-30}$ arylalkylene, substituted or unsubstituted $C_{1-30}$ heteroarylene, substituted or unsubstituted $C_{3-30}$ heteroarylalkylene, or a combination thereof, wherein $R^N$ is hydrogen, substituted or unsubstituted $C_{1-20}$ alkyl, substituted or unsubstituted $C_{1-20}$ heteroalkyl, substituted or unsubstituted $C_{6-30}$ aryl, or substituted or unsubstituted $C_{4-30}$ heteroaryl. More typically, the divalent linking group includes one or more of —O—, —S—, —C(O)—, $-N(R^N)-$, —S(O)—, $-S(O)_2-$, substituted or unsubstituted $C_{1-30}$ alkylene, substituted or unsubstituted $C_{3-30}$ cycloalkylene, substituted or unsubstituted $C_{1-30}$ heterocycloalkylene, substituted or unsubstituted $C_{6-30}$ arylene, substituted or unsubstituted $C_{7-30}$ arylalkylene, substituted or unsubstituted $C_{1-30}$ heteroarylene, substituted or unsubstituted $C_{3-30}$ heteroarylalkylene, or a combination thereof. The term "divalent linker" in reference to $X_3$, $T_1$, and $T_2$ also refers to one or more divalent linking groups as expressly described and claimed herein.

Organic underlayer films may be used to protect underlying substrates during various pattern transfer and etch processes. Often these films are cast and cured directly upon an inorganic substrate (e.g., TiN). In these cases, it is desirable that the underlayer film has sufficient adhesion to the substrate during all subsequent processing steps to protect the substrate from otherwise damaging processing conditions. One commonly used processing step is the wet etch process known as SC-1, which involves submerging the substrate and underlayers into a hydrogen peroxide/ammonium hydroxide bath. An underlayer film that is not sufficiently adhered to the substrate may delaminate while it is submerged, resulting in exposure of and damage to the underlying inorganic substrate.

It is also desirable that the underlayer film has sufficient planarization properties to provide the film with a relatively flat top surface if the underlying layer or substrate includes various pitch, various line/space patterns, and/or various trench depths. See, PL Evaluation, infra, Table 3.

In an embodiment, we provide a composition that may be applied to an underlayer or substrate to form a film layer over a substrate, that is, as a photoresist underlayer. In one aspect, the photoresist underlayer composition comprises a compound of Formula 1, or a polymer that includes a repeating unit represented by Formula 2, and a solvent.

In an embodiment, we provide a method of forming a pattern, the method comprising:

- providing a photoresist underlayer over a substrate;
- forming a photoresist layer over the photoresist underlayer;
- patterning the photoresist layer; and
- transferring a pattern from the patterned photoresist layer to the photoresist underlayer;
- wherein the photoresist underlayer is formed from a composition comprising a solvent and a compound represented by Formula 1

Formula 1

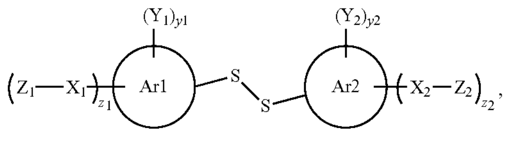

or a polymer having a repeating unit represented by Formula 2,

Formula 2

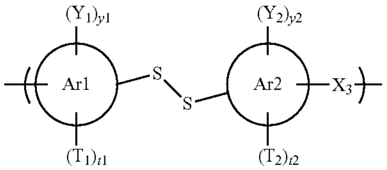

;

wherein in Formulae 1 and 2:

Ar1 and Ar2 independently represent an aromatic group;

each $Y_1$ and each $Y_2$ are independently —OH, —SH, —C(O)OH, —$NH_2$, —$R^A$, —$OR^A$, —$C(O)OR^A$, —$SR^A$, or —$NHR^A$, and $y_1$ and $y_2$ are independently an integer from 0 to 6;

$X_1$ and $X_2$ are independently a single bond or a divalent linker;

$X_3$ is a divalent linker;

$Z_1$ and $Z_2$ are independently —$OR^A$, —$C(O)OR^A$, —$SR^A$, —$NHR^A$, —$OC(O)CR^B{=}CH_2$, a substituted or unsubstituted $C_{1-18}$ alkyl group, a substituted or unsubstituted $C_{1-18}$ alkoxy group, a substituted or unsubstituted $C_{3-12}$ cycloalkyl group, a substituted or unsubstituted $C_{3-12}$ heterocycloalkyl group, a substituted or unsubstituted $C_{3-12}$ glycidyl group, a substituted or unsubstituted $C_{2-18}$ alkenyl group, a substituted or unsubstituted $C_{5-12}$ cycloalkenyl group, a substituted or unsubstituted $C_{3-18}$ alkynyl group, a substituted or unsubstituted $C_{6-14}$ aryl group, or a substituted or unsubstituted $C_{3-44}$ heteroaryl, $R^A$ is independently a substituted or unsubstituted $C_1$-$C_{18}$ alkyl, a substituted or unsubstituted $C_3$-$C_{12}$ cycloalkyl, a substituted or unsubstituted $C_3$-$C_{12}$ heterocycloalkyl, a substituted or unsubstituted $C_{2-18}$ alkenyl, a substituted or unsubstituted $C_{3-8}$ alkyne, a substituted or unsubstituted $C_6$-$C_{14}$ aryl, or a substituted or unsubstituted $C_6$-$C_{14}$ heteroaryl;

$R^B$ is hydrogen, fluorine, or a substituted or unsubstituted $C_{1-5}$ alkyl;

$T_1$ and $T_2$ are independently a divalent linker;

$z_1$ and $z_2$ are independently an integer from 0 to 6, or an integer from 0 to 3, and for the compound of Formula 1, $z_1+y_1$ is at least 1 and $z_2+y_2$ is at least 1; and $t_1$ and $t_2$ are independently an integer from 0 to 6, or an integer from 0 to 3.

In one aspect, Ar1 and Ar2 are independently monocyclic or polycyclic aromatic groups. When the group is polycyclic, the rings may be fused (such as naphthyl, anthracenyl, pyrenyl, or the like), directly linked (such as biphenyl, or the like), bridged by a heteroatom (such as triphenylamino or diphenylene ether). In an embodiment, the polycyclic aromatic group may include a combination of fused and directly linked rings (such as a linking of two naphthylene or the like).

In one aspect, Ar1 and Ar2 are independently an aromatic group with five to twenty ring carbons, or five to sixteen ring carbons, and optionally, include one to four ring heteroatoms chosen from N, O, or S.

It is further understood that any one or more ring carbons of Ar1 and Ar2 may be independently substituted as defined herein. For example, one to ten ring carbons of Ar1 and Ar2 may be substituted with any substituent defined herein.

In one aspect, a list of exemplary substituents may include, but is not limited to, substituted or unsubstituted $C_{1-10}$ alkyl, substituted or unsubstituted $C_{1-10}$ alkoxy, substituted or unsubstituted $C_{1-10}$ haloalkyl, substituted or unsubstituted $C_{4-6}$ cycloalkyl, substituted or unsubstituted $C_{3-5}$ heterocycloalkyl, substituted or unsubstituted $C_{2-10}$ alkenyl, substituted or unsubstituted $C_{2-10}$ alkynyl, substituted or unsubstituted $C_{6-14}$ aryl, substituted or unsubstituted $C_{6-18}$ aryloxy, substituted or unsubstituted $C_{7-14}$ arylalkyl, substituted or unsubstituted $C_{7-14}$ alkylaryl, substituted or unsubstituted $C_{3-14}$ heteroaryl, halogen, —CN, —$NO_2$, —$CO_2R^4$, where $R^4$ is H, —OH, or $C_{1-6}$ alkyl.

In one aspect, Ar1 and Ar2 of Formulae 1 or 2, are independently aromatic groups represented by Formula A or Formula B, or Ar1 and Ar2 of Formulae 1 or 2 are independently aromatic groups where a group of Formula A is directly bonded to a same or different group of Formula A, a group of Formula B is directly bonded to a same or different group of Formula B, or a group of Formula A is directly bonded to or a group of Formula B, Formula A

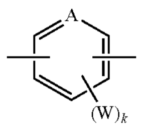

Formula B

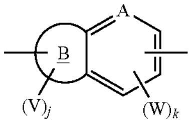

wherein, in Formula A and Formula B:

A is $CR^C$ or N, wherein $R^C$ is hydrogen, substituted or unsubstituted $C_{1-10}$ alkyl, substituted or unsubstituted $C_{1-10}$ alkoxy, or substituted or unsubstituted $C_{6-12}$ aryl, or substituted or unsubstituted $C_{6-12}$ heteroaryl;

ring B represents a fused aromatic group with one to four aromatic rings;

each V and each W represents a ring carbon that is optionally substituted as defined herein, where j is an integer from 0 to 6, and k is an integer from 0 to 2. Exemplary substituents for V and W include, but not limited to, —OH, —SH, —C(O)OH, —$NH_2$, —$R^A$, —$OR^A$, —$C(O)OR^A$, —$SR^A$, or —$NHR^A$, and $R^A$ is as defined above.

In one aspect, Ar1 and Ar2 of Formulae 1 and 2 are independently a substituted or unsubstituted phenyl, a substituted or unsubstituted naphthyl, a substituted or unsubstituted anthracenyl, a substituted or unsubstituted pyrenyl, a substituted or unsubstituted pyridinyl, a substituted or unsubstituted quinolinyl, a substituted or unsubstituted biphenylene, a substituted or unsubstituted triphenylene, a substituted or unsubstituted fluorenyl, or a substituted or unsubstituted carbazoyl.

In one aspect, $Z_1$ and $Z_2$ of Formula 1 are independently, represented by the following:

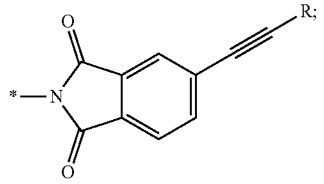

-continued

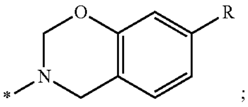
;
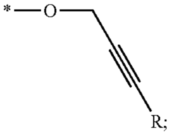
R;

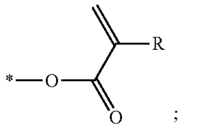
;
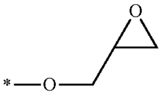
;

R;
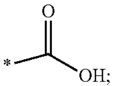
OH;

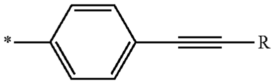
; or
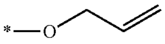
;

wherein in Formula 1,

- * represents a point of attachment to $X_1$ or $X_2$, or if $X_1$ or $X_2$ is a single bond then a point of connection to a ring carbon of Ar1 or Ar2, respectively, and
- R is hydrogen, substituted or unsubstituted $C_{1-22}$ alkyl, substituted or unsubstituted $C_{3-14}$ cycloalkyl, substituted or unsubstituted $C_{1-22}$ heteroalkyl, substituted or unsubstituted $C_{2-14}$ heterocycloalkyl, substituted or unsubstituted $C_{6-24}$ aryl, or substituted or unsubstituted $C_{3-24}$ heteroaryl.

In one aspect, the divalent linkers $X_3$, and if present, $T_1$ and/or $T_2$ are independently —O—, —S—, —C(O)—, —$S(O)_2$—, a substituted or unsubstituted $C_{1-8}$ alkylene, a substituted or unsubstituted $C_{3-10}$ cycloalkylene, a substituted or unsubstituted $C_{2-10}$ heterocycloalkylene, a substituted or unsubstituted $C_{6-14}$ arylene, a substituted or unsubstituted $C_{3-10}$ heteroarylene, or a combination thereof.

In one aspect, the divalent linker $X_3$, and if present, the divalent linkers $T_1$ and/or $T_2$, of the repeating unit of Formula 2 are independently a —O—, —S—, —C(O)—, or a group moiety of

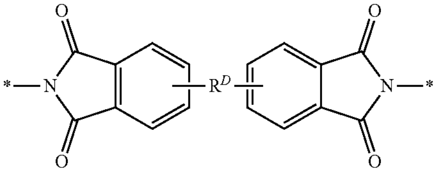
;

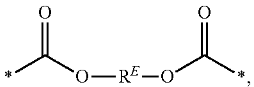
, or
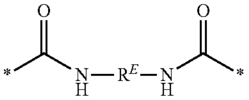
, $*—W—(Ar^4—(Z—Ar^5)_n—W^1)_m—*$;

wherein

- $R^D$ is a single bond, or —C(O)—, —$S(O)_2$—, a substituted or unsubstituted $C_{1-6}$ alkylene, a substituted or unsubstituted $C_{3-14}$ cycloalkylene, a substituted or unsubstituted $C_{1-22}$ heteroalkylene, a substituted or unsubstituted $C_{6-24}$ arylene, a substituted or unsubstituted $C_{3-24}$ heteroarylene, or a combination thereof
- $R^E$ is a substituted or unsubstituted $C_{1-6}$ alkylene, a substituted or unsubstituted $C_{3-14}$ cycloalkylene, a substituted or unsubstituted $C_{1-22}$ heteroalkylene, a substituted or unsubstituted $C_{6-24}$ arylene, a substituted or unsubstituted $C_{3-24}$ heteroarylene, or a combination thereof,
- W and $W^1$ are independently —O—, a substituted or unsubstituted $C_{1-4}$ alkylene, for example, —$CR^jR^k$—, a substituted or unsubstituted $C_{6-22}$ arylene, or a substituted or unsubstituted $C_{3-22}$ heteroarylene, or a combination thereof, wherein $R^j$ and $R^k$ are independently hydrogen, a substituted or unsubstituted $C_{1-18}$ alkyl, a substituted or unsubstituted $C_{6-22}$ aryl or a substituted or unsubstituted $C_{3-22}$ heteroaryl;
- $Ar^4$ and $Ar^5$ are independently a substituted or unsubstituted $C_{6-14}$ arylene, or a substituted or unsubstituted $C_{3-14}$ heteroarylene;
- Z is absent, O, —S—, —C(O)—, a substituted or unsubstituted $C_{1-4}$ alkylene;
- m is 0, 1, or 2; n is 0 or 1; and
- * represents a point of attachment for the divalent linker.

In one aspect, the photoresist underlayer composition further comprises a compound including an epoxy group or a polymer comprising an epoxy group.

In one aspect, the compound including an epoxy group may be represented by one of the following compounds

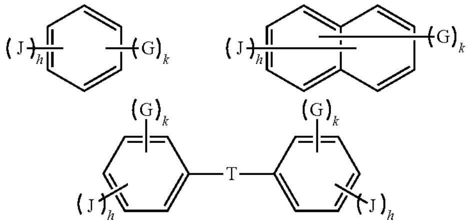

J is

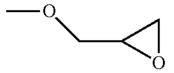

G is

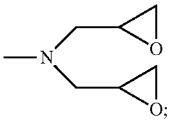
;

wherein k is 1, 2, 3, or 4, and each his 0, 1, or 2; and T is a single bond, —O—, —S—, —C(O)—, a substituted or unsubstituted $C_{1-4}$ alkylene, or —$NR^2$—, wherein $R^2$ is H, a substituted or unsubstituted $C_{1-4}$ alkyl, or a substituted or unsubstituted $C_{6-10}$ aryl.

In one aspect, the polymer having a repeating unit represented by Formula 2 can include one or more additional repeating units derived from monomer compounds known in the art, and therefore, provide a copolymer of two or more, e.g., three to six or more, different repeating units, including a repeating unit represented by Formula 2.

The photoresist underlayer composition may include a compound of Formula 1 and one or more polymers. For example, the photoresist underlayer composition may further include, for example, one or more polymers selected from polyacrylates, polyvinylethers, polyesters, polynorbornenes, polyacetals, polyethylene glycols, polyamides, polyacrylamides, polyphenols, novolacs, styrenic polymers, polyvinyl alcohols, copolymers thereof, or a combination thereof, not to be limited, by the exemplary list above.

The photoresist underlayer composition may include a polymer having a repeating unit represented by Formula 2 and one or more additional polymers. For example, the one or more polymers may be selected from polyacrylates, polyvinylethers, polyesters, polynorbornenes, polyacetals, polyethylene glycols, polyamides, polyacrylamides, polyphenols, novolacs, styrenic polymers, polyvinyl alcohols, copolymers thereof, or a combination thereof, and not to be limited, by the exemplary list above.

In one aspect, the photoresist underlayer composition further comprises a polymer derived from a monomer of Formula 4. The polymer of Formula 4 will include a side chain having a hydroxy or a glycidyl group.

Formula 4

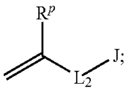

wherein $L_2$ is a divalent linking group;

J is a substituted or unsubstituted $C_1$-$C_{10}$ alkyl group with a hydroxy group or a glycidyl group, a substituted or unsubstituted $C_3$-$C_{10}$ cycloalkyl group with a hydroxy group or a glycidyl group, a substituted or unsubstituted $C_{6-24}$ aryl group with a hydroxy group or a glycidyl group, or a substituted or unsubstituted $C_{3-24}$ heteroaryl group with a hydroxy group or glycidyl group; and $R^P$ is hydrogen, fluorine, or an optionally substituted $C_{1-5}$ alkyl.

In one aspect, the photoresist underlayer composition further comprises a polymer including a repeating unit represented by Formula 5, Formula 5

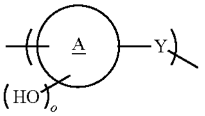

wherein in Formula 5

Ring A represents an aromatic group,

Y is a divalent linking group, and o is an integer from 1 to 8.

In one aspect, the photoresist underlayer composition may further include one or more polymers with one or more of the following catechol repeating units.

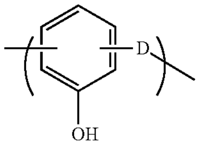

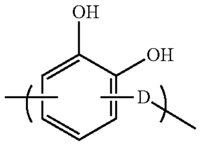

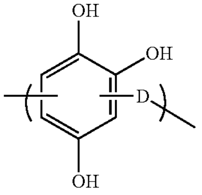

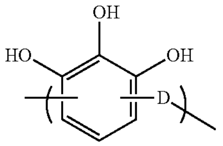

-continued

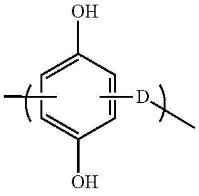

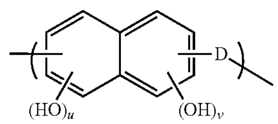

wherein in the above polymers

D is a substituted or unsubstituted $C_{1-4}$ alkylene, for example, —$CR^DR^E$—, a substituted or unsubstituted $C_{6-22}$ arylene, or a substituted or unsubstituted $C_{3-22}$ heteroarylene, or a combination thereof, where $R^D$ and $R^E$ are independently hydrogen, a substituted or unsubstituted $C_{1-18}$ alkyl, a substituted or unsubstituted $C_{6-22}$ aryl, or a substituted or unsubstituted $C_{3-22}$ heteroaryl.

and u is an integer of 0 to 3, v is an integer of 0 to 3, where u+v=1 or more.

In one aspect, the photoresist underlayer composition may include a copolymer with a repeating unit of Formula 2 and a repeating unit of Formula 5.

In one aspect, a compound of Formula 1 is represented by the following:

A1

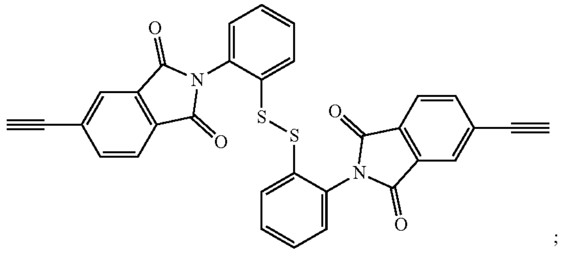

;

A4

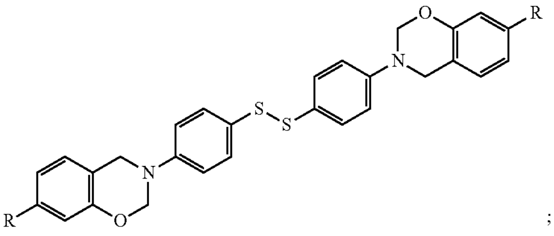

;

R:

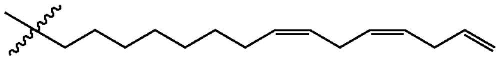

A5

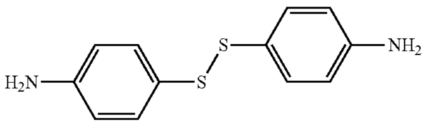

; or

A6

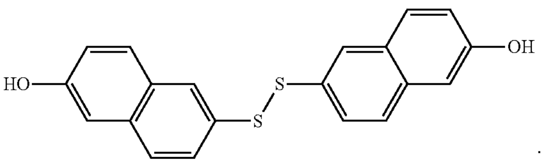

.

In one aspect, a polymer of with a repeating unit of Formula 2 is represented by the following:

A2

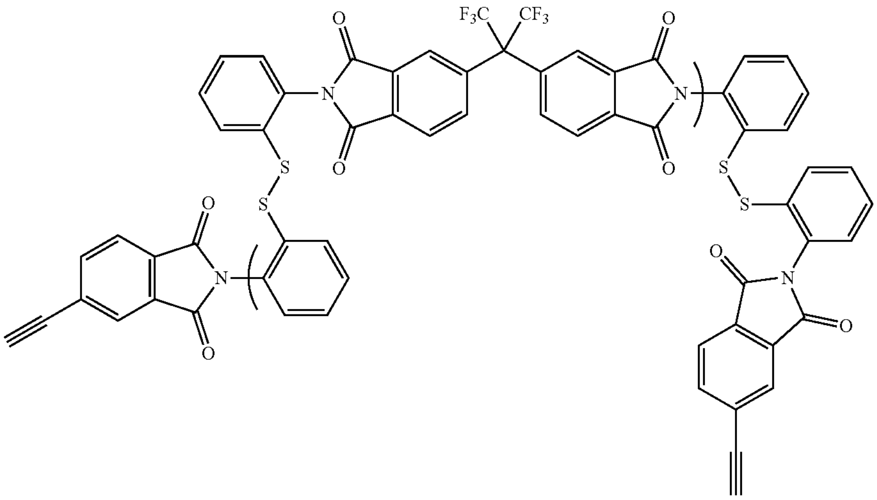

;

A3

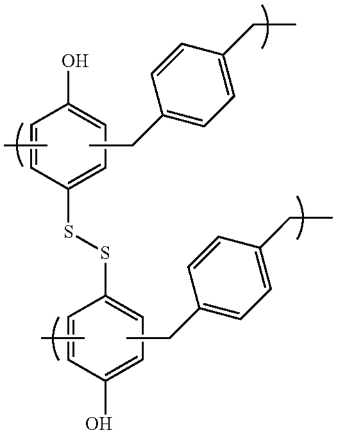

;

or a repeating unit of Formula 2, wherein $y_1$ and $y_2$ are independently 0, 1, 2, or 3 and $y_1+y_2$ is at least 1, each $Y_1$ and each $Y_2$ are independently —OH, —SH, —C(O)OH, —$NH_2$, $R^A$, —$OR^A$, —C(O)$OR^A$, —$SR^A$, or —$NHR^A$, and $R^A$ is independently a substituted or unsubstituted $C_1$-$C_6$ alkyl, a substituted or unsubstituted $C_3$-$C_6$ heterocycloalkyl, or a substituted or unsubstituted $C_6$-$C_{14}$ aryl; and $X_3$, $T_1$, and $T_2$ independently comprise an aromatic group with one to three aromatic rings, and/or $$*\text{—}W\text{—}(Ar^4\text{—}(Z\text{—}Ar^5)_n\text{—}W^1)_m\text{—}*$$

W and $W^1$ are independently a substituted or unsubstituted $C_{1\text{-}4}$ alkylene, —O—, or a combination thereof;

$Ar^4$ and $Ar^{=}$are independently a substituted or unsubstituted $C_{6\text{-}14}$ arylene, or a substituted or unsubstituted $C_{3\text{-}14}$ heteroarylene;

Z is absent, O, —S—, —C(O)—, a substituted or unsubstituted $C_{1\text{-}4}$ alkylene;

m is 0, 1, or 2; n is 0 or 1; and

* represents a point of attachment for the divalent linker $t_1$ and $t_2$ are independently 0, 1, or 2.

In one aspect, $X_3$, and if present, $T_1$ and/or $T_2$, of a polymer with a repeating unit of Formula 2 is a divalent linker that includes an aromatic group. For example, the divalent aromatic group of $X_3$ can include an aromatic ring system with one to six, e.g., one to three, independently substituted or unsubstituted aromatic rings. If the aromatic group includes two to six aromatic rings, then two or more aromatic rings can be connected by a single bond or a divalent linker, or two or more of the aromatic rings can be fused aromatic rings.

In one aspect, a polymer with a repeating unit of Formula 2, $y_1$ and $y_2$ are independently 0, 1, 2, or 3, each $Y_1$ and each $Y_2$ are independently —OH, —SH, —C(O)OH, —$NH_2$, —$OR^A$, —C(O)$OR^A$, —$SR^A$, or —$NHR^A$, and $R^A$ is independently a substituted or unsubstituted $C_1$-$C_6$ alkyl, a substituted or unsubstituted $C_3$-$C_6$ heterocycloalkyl, or a substituted or unsubstituted $C_6$-$C_{14}$ aryl.

In one aspect, a polymer with a repeating unit of Formula 2, at least one $T_1$ and/or at least one $T_2$, i.e., $t_1+t_2$ is 1 or more, (e.g., $t_1+t_2$ is an integer of 1, 2, or 3). $T_1$ and $T_2$ represent branching in a polymer with a repeating unit of Formula 2, and each $T_1$ or each $T_2$ can be the same or different and depends on the presence of additives used in the preparation of the polymer.

As noted, the composition, e.g., a photoresist underlayer composition may include a compound represented by Formula 1, hereinafter, "Formula 1 compound". The Formula 1 compound may be the only compound in the photoresist underlayer composition that is combined with the solvent. In another aspect, the Formula 1 compound is present in the photoresist underlayer composition in an amount from 5 to 95 wt %, based on the total solids of the composition. For example, a Formula 1 compound is present in the photoresist underlayer composition in an amount from 20 to 80 wt %, 30 to 80 wt %, 40 to 80 wt %, or 50 to 75 wt %, based on the total solid content of the composition.

As noted, the composition, e.g., a photoresist underlayer composition may include a polymer having a repeating unit represented by Formula 2, at times, referred to hereinafter, as a "Formula 2 polymer". The Formula 2 polymer may be the only polymer in the photoresist underlayer composition that is combined with the solvent. In another aspect, the Formula 2 polymer is present with one or more additional polymers in the photoresist underlayer composition in an amount from 5 to 95 wt %, based on the total solids of the composition. For example, a Formula 2 polymer is present in the resist underlayer composition in an amount from 20 to 80 wt %, 30 to 80 wt %, 40 to 80 wt %, or 50 to 75 wt %, based on the total solid content of the composition.

In one aspect, a polymer with a repeating unit of Formula 2 may have a weight average molecular weight ($M_w$) of 1,000 to 80,000 grams per mole (g/mol), 1,000 to 20,000 g/mol, or 1,000 to 8,000 g/mol, or a number average molecular weight ($M_n$) of 500 to 70,000 g/mol or 500 to 10,000 g/mol. Molecular weights (either $M_w$ or $M_n$) are suitably determined by gel permeation chromatography (GPC) using polystyrene standards.

In some aspects, the photoresist underlayer composition may further include one or more curing agents to aid in the curing of the photoresist underlayer composition, for example after the photoresist underlayer composition has been applied to a surface. A curing agent is any component which causes curing of the photoresist underlayer composition on the surface of a substrate. The amount of such curing agents useful in the present compositions may be, for example, from greater than 0 to 10 wt %, and typically from greater than 0 to 3 wt % based on total solids of the photoresist underlayer composition.

It may be beneficial to include an acid generator compound such as a photoacid generator (PAG) and/or a thermal acid generator (TAG) compound or polymer in the photoresist underlayer compositions. Preferred curing agents are thermal acid generators (TAGs).

A TAG compound is any compound that liberates acid upon exposure to heat. Exemplary thermal acid generators include, without limitation, amine blocked strong acids, such as amine blocked sulfonic acids such as amine blocked dodecylbenzenesulfonic acid. It will also be appreciated by those skilled in the art that certain photoacid generators are able to liberate acid upon heating and may function as thermal acid generators.

In some aspects, the photoresist underlayer composition does not include a photoacid or thermal acid generator. Accordingly, the photoresist underlayer composition may be substantially free of a PAG or TAG compound and/or a PAG or TAG polymer.

The photoresist underlayer composition may include one or more optional additives including, for example, surfactants, antioxidant, or the like, or a combination thereof. When present, each optional additive may be used in the photoresist underlayer composition in minor amounts such as from 0.01 to 10 wt %, based on total solids of the photoresist underlayer composition.

Typical surfactants include those which exhibit an amphiphilic nature, meaning that they may be both hydrophilic and hydrophobic at the same time. Amphiphilic surfactants possess a hydrophilic head group or groups, which have a strong affinity for water and a long hydrophobic tail, which is organophilic and repels water. Suitable surfactants may be ionic (i.e., anionic, cationic) or nonionic. Further examples of surfactants include silicone surfactants, poly(alkylene oxide) surfactants, and fluorochemical surfactants. Suitable non-ionic surfactants include, but are not limited to, octyl and nonyl phenol ethoxylates such as TRITON X-114, X-100, X-45, X-15 and branched secondary alcohol ethoxylates such as TERGITOL TMN-6 (The Dow Chemical Company, Midland, Mich. USA). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in *McCutcheon's Emulsifiers and Detergents,* North American Edition for the Year 2000 published by Manufacturers Confectioners Publishing Co. of Glen Rock, N.J. Nonionic surfactants that are acetylenic diol derivatives also may be suitable. Such surfactants are commercially available from Air Products and Chemicals, Inc. of Allentown, Pa. and sold under the trade names of SURFYNOL and DYNOL. Additional suitable surfactants include other polymeric compounds such as the tri-block EO-PO-EO co-polymers PLURONIC 25R2, L121, L123, L31, L81, L101, and P123 (BASF, Inc.).

The photoresist underlayer composition includes a solvent. The solvent component may be a single solvent or may include a mixture of two or more distinct solvents. Suitably, each of the multiple solvents may be miscible with each other. Suitable solvents include, for example, one or more oxyisobutyric acid esters, particularly methyl-2-hydroxyisobutyrate, 2-hydroxyisobutyric acid, and ethyl lactate; one or more of glycol ethers, particularly 2-methoxyethyl ether (diglyme), ethylene glycol monomethyl ether, and propylene glycol monomethyl ether; one or more solvents that have both ether and hydroxy moieties, particularly methoxy butanol, ethoxy butanol, methoxy propanol, and ethoxy propanol; one or more alkyl esters, particularly methyl cellosolve acetate, ethyl cellosolve acetate, propylene glycol monomethyl ether acetate, and dipropylene glycol monomethyl ether acetate and other solvents such as one or more dibasic esters; and/or other solvents such as one or more of propylene carbonate and gamma-butyro lactone.

The desired total solids of the photoresist underlayer composition will depend on factors such as the desired final layer thickness. Typically, the total solids of the photoresist underlayer composition may be from 0.1 to 20 wt %, for example, from 0.1 to 10 wt %, more typically, from 0.11 to 5 wt %, based on the total weight of the coating composition.

The photoresist underlayer composition may be prepared following known procedures. The photoresist underlayer composition may be used as is or may be subjected to purification or dilution prior to being coated on the substrate. Purification may involve, for example, one or more of centrifugation, filtration, distillation, decantation, evaporation, treatment with ion exchange beads, and the like.

The patterning methods of the present invention comprise applying a layer of the photoresist underlayer composition over a substrate; curing the applied photoresist underlayer composition to form a coated underlayer; and forming a photoresist layer over the coated underlayer. The method may further include the steps of pattern-wise exposing the photoresist layer to activating radiation; and developing the exposed photoresist layer to provide a resist relief image. In some aspects, the method may further include forming a silicon-containing layer, an organic antireflective coating layer, or a combination thereof, over the coated underlayer prior to forming the photoresist layer. In some aspects, the method may further include transferring the pattern to the silicon-containing layer, the organic antireflective coating layer, or the combination thereof, after developing an exposed photoresist layer and before the step transferring the pattern to the coated underlayer.

A wide variety of substrates may be used in the patterning methods, with electronic device substrates being typical. Suitable substrates include, for example, packaging substrates such as multichip modules; flat panel display substrates; integrated circuit substrates; substrates for light emitting diodes (LEDs) including organic light emitting diodes (OLEDs); semiconductor wafers; polycrystalline silicon substrates; and the like. Suitable substrates may be in the form of wafers such as those used in the manufacture of integrated circuits, optical sensors, flat panel displays, integrated optical circuits, and LEDs. As used herein, the term "semiconductor wafer" is intended to encompass "an electronic device substrate," "a semiconductor substrate," "a semiconductor device," and various packages for various levels of interconnection, including a single-chip wafer, multiple-chip wafer, packages for various levels, or other assemblies requiring solder connections. Such substrates may be any suitable size. Typical wafer substrate diameters are 200 mm to 300 mm, although wafers having smaller and larger diameters may be suitably employed according to the present invention. As used herein, the term "semiconductor substrate" includes any substrate having one or more semiconductor layers or structures which may optionally include active or operable portions of semiconductor devices. A semiconductor device refers to a semiconductor substrate upon which at least one microelectronic device has been or is being batch fabricated.

The substrates are typically composed of one or more of silicon, polysilicon, silicon oxide, silicon nitride, silicon oxynitride, silicon germanium, gallium arsenide, aluminum, sapphire, tungsten, titanium, titanium-tungsten, nickel, copper, and gold. The substrate may include one or more layers and patterned features. The layers may include, for example, one or more conductive layers such as layers of aluminum, copper, molybdenum, tantalum, titanium, tungsten, alloys, nitrides, or silicides of such metals, doped amorphous silicon or doped polysilicon, one or more dielectric layers such as layers of silicon oxide, silicon nitride, silicon oxynitride, or metal oxides, semiconductor layers, such as single-crystal silicon, and combinations thereof. In some aspects, the substrate includes titanium nitride. The layers can be formed by various techniques, for example, chemical vapor deposition (CVD) such as plasma-enhanced CVD (PECVD), low-pressure CVD (LPCVD) or epitaxial growth, physical vapor deposition (PVD) such as sputtering or evaporation, or electroplating.

It may be desired in certain patterning methods of the invention to provide one or more lithographic layers such as a hardmask layer, for example, a spin-on-carbon (SOC), amorphous carbon, or metal hardmask layer, a CVD layer such as a silicon nitride (SiN) layer, silicon oxide (SiO) layer, or silicon oxynitride (SiON) layer, an organic or inorganic BARC layer, or a combination thereof, on an upper surface of the substrate prior to forming the photoresist underlayer of the invention. Such layers, together with a layer of the photoresist underlayer composition of the invention and photoresist layer, form a lithographic material stack. Typical lithographic stacks which may be used in the patterning methods of the invention include, for example, the following: SOC layer/underlayer/photoresist layer; SOC layer/SiON layer/underlayer/photoresist layer; SOC layer/SiARC layer/underlayer/photoresist layer; SOC layer/metal hardmask layer/underlayer/photoresist layer; amorphous carbon layer/underlayer/photoresist layer; and amorphous carbon layer/SiON layer/underlayer/photoresist layer.

It is to be understood that the "photoresist underlayer," as used herein, refers to the one or more layers that are disposed between the substrate and the photoresist layer (i.e., "above the substrate"). Accordingly, the inventive coated underlayer (i.e., a layer of the photoresist underlayer composition) may be used alone as a photoresist underlayer, or the inventive coated underlayer (i.e., a layer of the photoresist underlayer composition) may be used in conjunction with other underlayers, including those as described herein.

The photoresist underlayer composition may be coated on the substrate by any suitable means, such as spin-coating, slot-die coating, doctor blading, curtain-coating, roller-coating, spray-coating, dip-coating, and the like. In the case of a semiconductor wafer, spin-coating is preferred. In a typical spin-coating method, the present compositions are applied to a substrate which is spinning at a rate of 500 to 4000 revolutions per minute (rpm) for a period of 15 to 90 seconds to obtain a desired layer of the condensed polymer on the substrate. It will be appreciated by those skilled in the art that the thickness of the coated layer may be adjusted by changing the spin speed, as well as the solids content of the composition. An underlayer formed from the photoresist underlayer composition typically has a dried layer thickness from 1 to 50 nanometers (nm), more typically from 1 to 10 nm.

The coated photoresist underlayer composition is optionally softbaked at a relatively low temperature to remove any solvent and other relatively volatile components. Typically, the substrate is baked at a temperature of less than or equal to 150° C., preferably from 60 to 125° C., and more preferably from 90 to 115° C. The baking time is typically from 10 seconds to 10 minutes, preferably from 30 seconds to 5 minutes, and more preferably from 6 to 90 seconds. When the substrate is a wafer, such baking step may be performed by heating the wafer on a hot plate. Such softbaking step may be performed as part of the curing of the coating layer or may be omitted altogether.

The photoresist underlayer composition is sufficiently cured such that the photoresist underlayer film does not intermix, or minimally intermixes, with another underlayer component or the photoresist layer to be formed above the underlayer. The photoresist underlayer composition may be cured in an oxygen-containing atmosphere, such as air, or in an inert atmosphere, such as nitrogen and under conditions, such as heating, sufficient to provide a cured coating layer. This curing step is preferably conducted on a hot plate-style apparatus, although oven curing may be used to obtain equivalent results. Typically, the curing may be conducted at a temperature of 150° C. or greater, and preferably 150 to 450° C. The curing time is typically from 10 seconds to 10 minutes. Optionally, a ramped or a multi-stage curing process may be used. A ramped bake typically begins at a relatively low (e.g., ambient) temperature that is increased at a constant or varied ramp rate to a higher target temperature.

After curing of the applied photoresist underlayer composition, a photoresist layer is formed over the photoresist underlayer. As noted above, other intervening layers may be applied between the photoresist underlayer and the overcoated photoresist layer. In some aspect, the method may further include forming a silicon-containing layer, an organic antireflective coating layer, or a combination thereof, over the coated underlayer prior to forming the photoresist layer.

A wide variety of photoresists may be suitably used in the methods of the invention and are typically positive-tone materials. The particular photoresists to be used will depend on the exposure wavelength used and generally comprise an acid-sensitive matrix polymer, a photoactive component such as a photoacid generator, a solvent, and optional additional components. Suitable photoresists are known to those skilled in the art and are commercially available, for example, various photoresist materials in the UV™ and EPIC™ product families from DuPont Electronics & Industrial. The photoresist can be applied to the substrate by known coating techniques such as described above with reference to the underlayer composition, with spin-coating being typical. A typical thickness for the photoresist layer is from 10 to 300 nm. The photoresist layer is typically next soft baked to minimize the solvent content in the layer, thereby forming a tack-free coating and improving adhesion of the layer to the substrate. The soft bake can be conducted on a hotplate or in an oven, with a hotplate being typical. Typical soft bakes are conducted at a temperature from 70 to 150° C., and a time from 30 to 90 seconds.

The photoresist layer is next exposed to activating radiation through a photomask to create a difference in solubility between exposed and unexposed regions. References herein to exposing a photoresist composition to radiation that is activating for the composition indicates that the radiation is capable of forming a latent image in the photoresist composition. The photomask has optically transparent and optically opaque regions corresponding to regions of the resist layer to be exposed and unexposed, respectively, by the activating radiation. The exposure wavelength is typically sub-400 nm, and more typically, sub-300 nm, such as 248 nm (KrF), 193 nm (ArF), or an EUV wavelength (e.g., 13.5 nm). In a preferred aspect, the exposure wavelength is 193 nm or an EUV wavelength. The exposure energy is typically from 10 to 100 millijoules per square centimeter ($mJ/cm^2$), depending, for example, on the exposure tool and the components of the photosensitive composition.

Following exposure of the photoresist layer, a post-exposure bake (PEB) is typically performed. The PEB can be conducted, for example, on a hotplate or in an oven. The PEB is typically conducted at a temperature from 70 to 150° C., and a time from 30 to 90 seconds. A latent image defined by the boundary between polarity-switched and unswitched regions (corresponding to exposed and unexposed regions, respectively) is thereby formed. The photoresist layer is next developed to remove the exposed regions of the layer, leaving the unexposed regions forming a patterned photoresist layer. The developer is typically an aqueous alkaline developer, for example, a tetra-alkyl ammonium hydroxide solution such as a tetramethylammonium hydroxide (TMAH) solution, typically a 0.26 Normality (N) (2.38 wt %) solution of TMAH. The developer may be applied by known techniques, for example, spin-coating or puddle coating.

The pattern of the photoresist layer can be transferred to one or more underlying layers including the coated underlayer and to the substrate by appropriate etching techniques, such as by plasma etching using appropriate gas species for each layer being etched. Depending on the number of layers and materials involved, pattern transfer may include multiple etching steps using different etching gases. The patterned photoresist layer, the coated underlayer, and the other optional layers in the lithographic stack may be removed following pattern transfer to the substrate using conventional techniques. Optionally, one or more of the layers of the stack may be removed following, or consumed during, pattern transfer to an underlying layer and prior to pattern transfer to the substrate. For example, pattern transfer to one or more of a silicon-containing layer, an organic antireflective coating layer, or the like may occur after the exposed photoresist layer is developed and before pattern transfer to the coated underlayer. The substrate is then further processed according to known processes in the art to form an electronic device.

Also provided is a coated substrate that includes a layer of the inventive photoresist underlayer composition on a substrate; and a photoresist layer disposed on the layer of the photoresist underlayer composition.

Still other aspects provide a layered article including a photoresist underlayer derived from the inventive photoresist underlayer composition. In an embodiment, a layered article may include a substrate; a coated underlayer disposed over the substrate; and a photoresist layer disposed over the coated underlayer.

Photoresist underlayers prepared from the inventive photoresist underlayer compositions show excellent planarization characteristics. The photoresist underlayer compositions of the invention may, as a result, be useful in a variety of semiconductor manufacturing processes The present inventive concept is further illustrated by the following examples, which are intended to be non-limiting. The compounds and reagents used herein are available commercially except where a procedure is provided below.

EXAMPLES

Synthesis Example 1: A-1

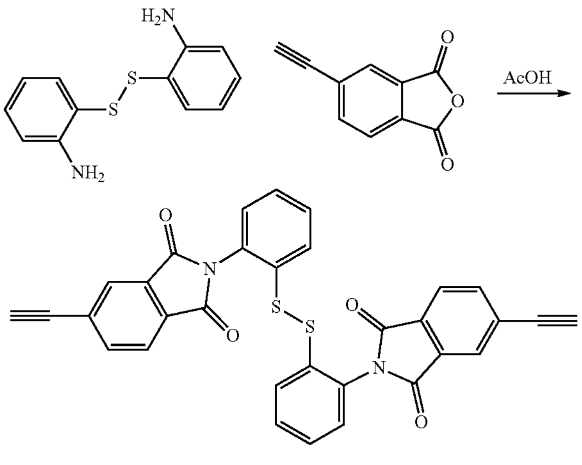

A-1

2-2'dithiodianiline (5.2 g) and 4-ethynylphthalic anhydride (7.2 g) were mixed together in a 250 mL round bottom flask. Glacial acetic acid (100 mL) was added and the mixture was heated to reflux for 16 hours. The solution was cooled to room temperature and then filtered to remove the small amount of precipitate that had formed. The filtrate was then precipitated into 1 L of 1:1 methanol:water (v/v). The solid was collected by filtration and stirred in fresh 1:1 methanol:water (v/v) for 3 hours before being collected by filtration and dried under vacuum at 50° C. overnight, yielding 8.51 g of product A-1

Synthesis Example 2: A-2

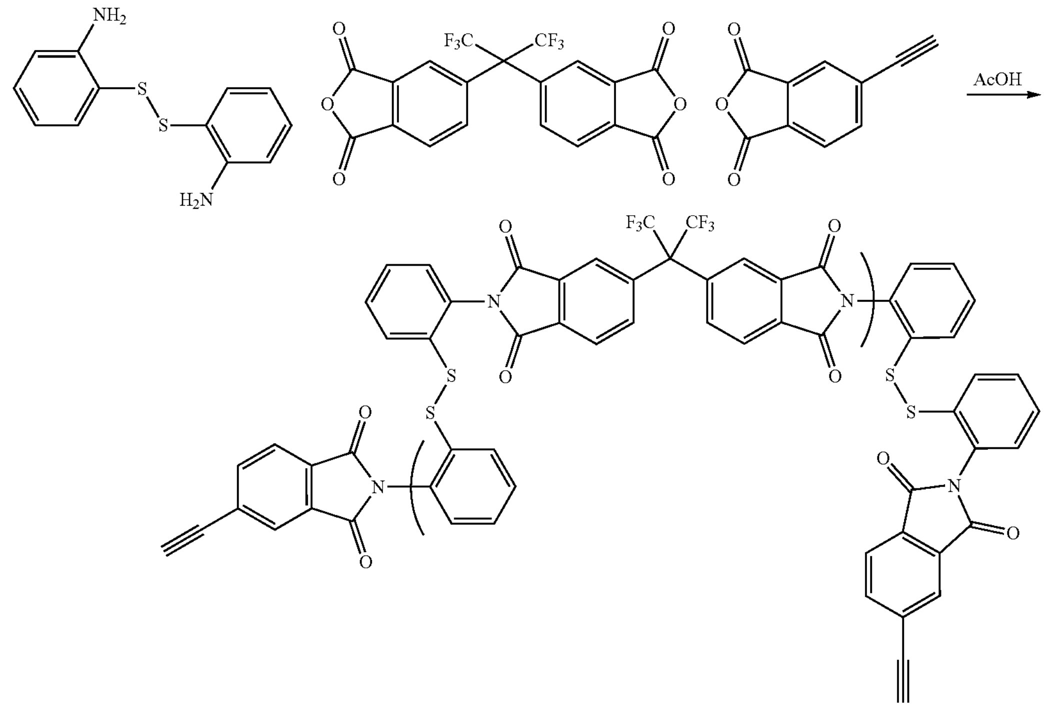

A-2

2-2'dithiodianiline (5.0 g) and 4,4'-(Hexafluoroisopropylidene)diphthalic anhydride (8.5 g) were mixed together in a 250 mL round bottom flask. Glacial acetic acid (100 mL) was added and the mixture was heated to 60° C. for 70 minutes. 4-Ethynylphthalic anhydride (7.0 g) was then added and the temperature was raised to 125° C. for 18 hours. The solution was cooled to room temperature and then added to 1 L of isopropanol resulting in a precipitate. The solid was collected by filtration, dissolved into tetrahydrofuran (50 mL and added into 1 L water to again form a precipitate. The solid was collected by filtration and dried under vacuum at 50° C. overnight, yielding 6.62 g of product A-2. Mw (by GPC): 2062 g/mol.

Synthesis Example 3: A-3

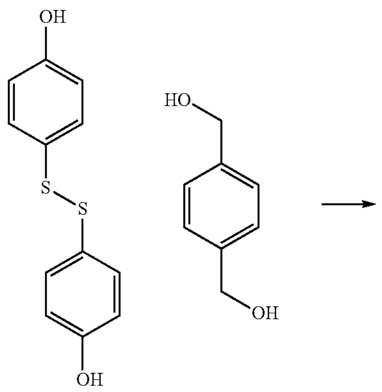

-continued

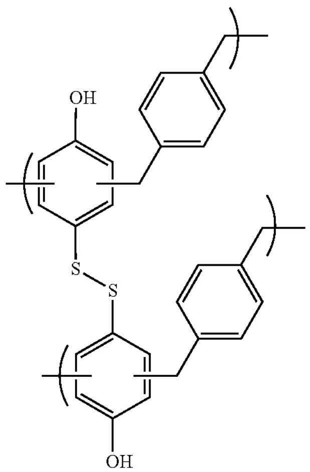

A-3

Bis(4-hydroxyphenyl) disulfide (6.0 g) and 1,4-benzenedimethanol (1.3 g) were dissolved in propylene glycol methyl ether (15 mL) in a 100 mL round bottom flask. Methanesulfonic acid (0.48 g) was then added and the solution was heated to 120° C. for 20 hours and then cooled to room temperature. The solution was added into 500 mL 3:1 water:methanol (v/v) resulting in a precipitate, and the solid was collected by filtration. The solid was dissolved in tetrahydrofuran (15 mL) and added into 500 mL 95:5 heptanes:isopropanol (v/v) resulting in a precipitate. The solvent was decanted off and the solid product was dried under vacuum at 50° C. overnight, yielding 3.4 g of product A-3. Mw (by GPC): 1402 g/mol.

Synthesis Example 4: A-4

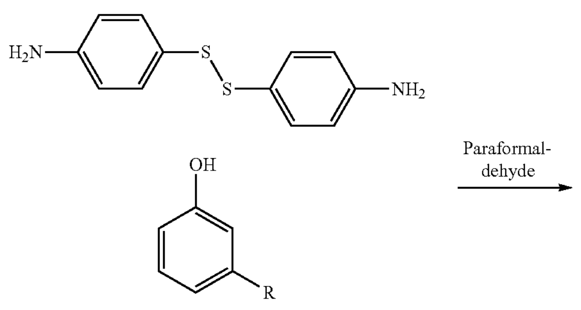

Cardanol

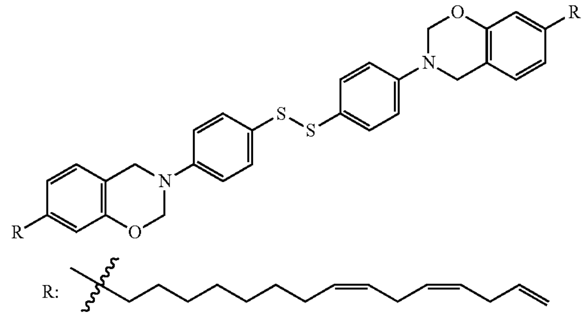

A-4

A mixture of 4-4'dithiodianiline (5.0 g), cardanol (12.0 g) and paraformaldehyde (2.4 g) were added to a 100 mL round bottom flask, and the mixture heated to 80° C. for 2.5 hours. The resulting solid reaction product was dissolved in dichloromethane (~30 mL) and added into 500 mL methanol resulting in a precipitate. The solid was collected by filtration and dried under vacuum at 50° C. overnight yielding 10.1 g of product A-4.

Comparative Synthesis Example 1: X-1

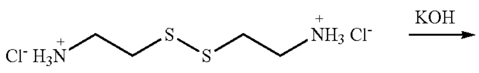

-continued

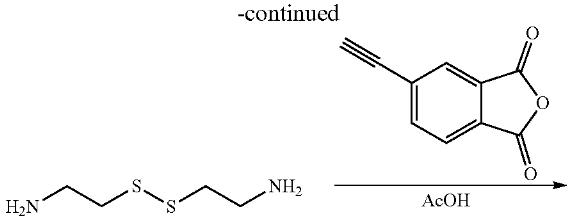

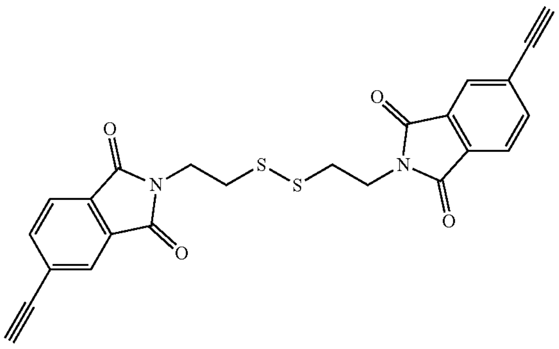

X-1

Cystamine dihydrochloride (25.0 g) was dissolved in water (300 mL). Potassium hydroxide (20.3 g) was added and the solution was stirred for 10 minutes. The solution was extracted with dichloromethane (150 mL×3). The organic extractions were combined and concentrated by rotary evaporation, yielding 7.2 g of cystamine. The isolated cystamine (7.2 g) was combined with 4-Ethynylphthalic anhydride (16.3 g) in a 500 mL round bottom flask. Glacial acetic (230 mL) was then added and the solution was heated to reflux for 16 hours and then cooled to room temperature. The solution was filtered to remove solids and the filtrate was added into 1.5 L water resulting in a precipitate. The solid was collected by filtration and dried under vacuum yielding 3.6 g of product X-1.

Comparative Synthesis Example 2: X-2

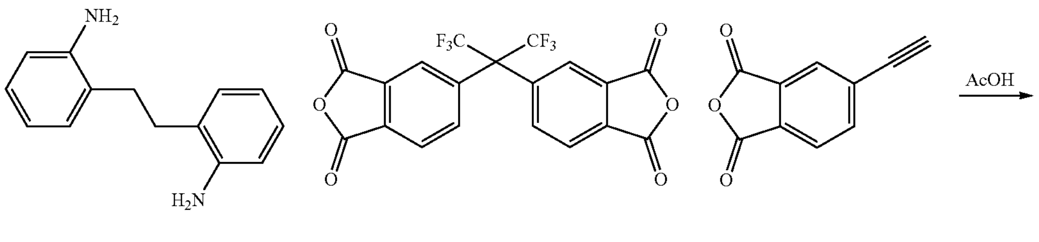

-continued

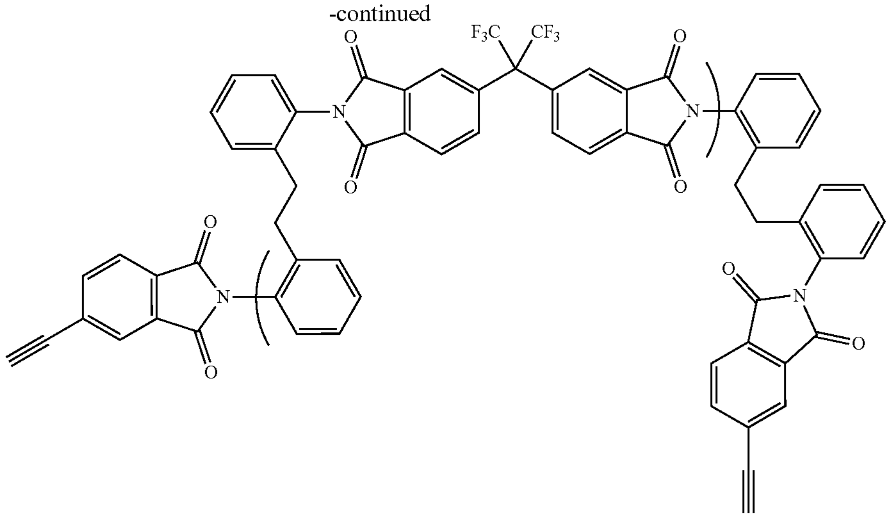

X-2

2-2'(Ethane-1,2-diyl)dianiline (4.9 g) and 4,4'-(Hexafluoroisopropylidene) diphthalic anhydride (8.9 g) were added to a 250 mL round bottom flask. Glacial acetic acid (100 mL) was added and the mixture heated to 60° C. for 70 minutes. 4-Ethynylphthalic anhydride (7.3 g) was then added and the temperature was raised to 125° C. for 18 hours. The solution was then cooled to room temperature and then added into 1 L of isopropanol resulting in a precipitate. The solid was collected by filtration, dissolved into tetrahydrofuran (50 mL) and added into 1 L water. The resulting solid was collected by filtration and dried under vacuum at 50° C. overnight, yielding 5.5 g of product X-2. Mw (by GPC): 1936 g/mol.

Thermal Stability of Aromatic vs Aliphatic Disulfide

TABLE 1

| Material | Td95% (air) |
|---|---|
| A-1 | 481° C. |
| X-1 | 366° C. |

As can be seen from Table 1, the material A-1 with aromatic disulfide linkages has improved thermal stability (as determined by thermal gravimetric analysis) than X-1 which contains aliphatic disulfide linkages.

Underlayer Composition Preparation

Underlayer composition formulations for Examples 1 to 6 and Comparative Examples 1-5 were prepared by mixing the components in Table 2 with the relative mass amounts (in grams) provided in parenthesis.

TABLE 2

| Example | Component 1 | Component 2 | Component 3 | Solvent |
|---|---|---|---|---|
| Example 1 | A-1 (4.2) | — | — | PGMEA(91.0)/GBL(4.8) |
| Example 2 | A-2 (4.2) | — | — | PGMEA(91.0)/GBL(4.8) |
| Example 3 | A-3 (1.8) | B-2 (2.4) | — | PGMEA(91.0)/GBL(4.8) |
| Example 4 | A-5 (0.4) | B-1 (1.6) | B-3 (2.2) | PGMEA(91.0)/GBL(4.8) |
| Example 5 | A-6 (0.4) | B-1 (1.6) | B-3 (2.2) | PGMEA(91.0)/GBL(4.8) |
| Example 6 | A-4 (2.1) | B-4 (2.1) | — | CHO(91.0)/GBL(4.8) |

TABLE 2-continued

| Example | Component 1 | Component 2 | Component 3 | Solvent |
|---|---|---|---|---|
| Comparative Example 1 | X-2 (4.2) | — | — | PGMEA(91.0)/GBL(4.8) |
| Comparative Example 2 | B-1 (1.8) | B-2 (2.4) | — | PGMEA(91.0)/GBL(4.8) |
| Comparative Example 3 | B-1 (1.8) | B-3 (2.4) | — | PGMEA(91.0)/GBL(4.8) |
| Comparative Example 4 | X-3 (0.4) | B-1 (1.8)) | B-3 (2.2) | PGMEA(91.0)/GBL(4.8) |
| Comparative Example 5 | X-4 (1.7) | B-4 (2.5) | — | PGMEA(93.0)/BB(2.8) |

PGMEA: Propylene glycol methyl ether acetate; GBL: Gamma-butyrolactone, CHO: cyclohexanone;

X-3 is 4,4'-Ethylenedianiline,

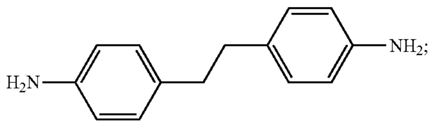 [SMILES: Nc1ccc(CCc2ccc(N)cc2)cc1]

and

X-4 is

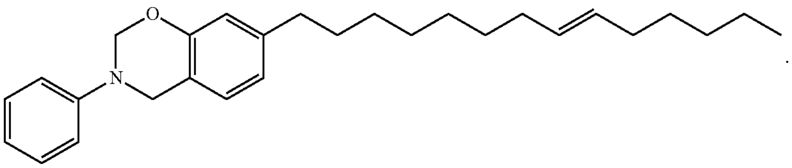 [SMILES: CCCCC/C=C/CCCCCCCc1ccc2c(c1)OCN(c1ccccc1)C2]

.

Compounds B1 to B4 are indicated below.

(B-1)

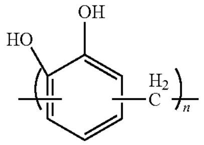

Catechol Novolac
(Mw (GPC) = 3922 g/mol)

(B-2)

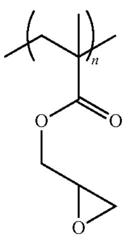

Poly(glycidyl methacrylate)
(Mw (GPC) = 3922 g/mol)

-continued (B-3)

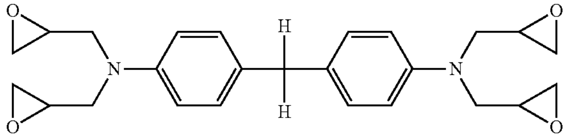

4,4′-methylenebis(N,N-diglycidylaniline)

(B-4)

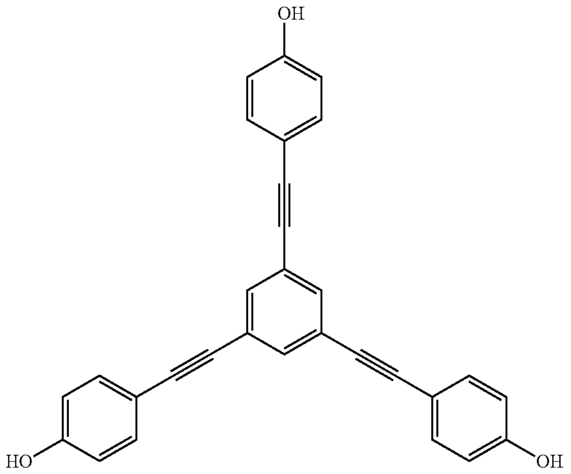

1,3,5-Tris(4-hydroxyphenylethynyl)benzene

Functional Performance of Underlayers

Each composition in Table 2 was spin-coated onto a respective 200 mm silicon wafer on an ACT-8 Clean Track (Tokyo Electron Co.) at 1500 rpm, and then cured at conditions listed in Table 3 to form a film. Initial film thickness was measured with a Therma-Wave OptiProbe™ metrology tool. PGMEA remover was then applied to each of the films for 90 seconds followed by a post-strip bake at 105° C. for 60 seconds. The thickness of each film was again measured to determine the amount of film thickness lost. The difference in film thickness before and after contact with the PGMEA remover is measured to determine the percentage of film thickness remaining on the wafer (% Film Remaining). This value is indicative of the degree of crosslinking of the polymeric layer.

The photoresist underlayer composition of the invention were evaluated to determine their planarization properties. Templates with a $SiO_2$ film thickness of 100 nm were prepared with various pitch and patterns using a die size of 1 cm×1 cm. Each die started with a 100 nm isolated step pattern followed by a 2000 μm non-pattern open area, followed by various line/space patterns that covered 45 nm/90 nm to 2 μm/5 μm trenches. The template coupons were baked at 150° C. for 60 seconds as a dehydration bake prior to coating the coupons with the present compositions. Each photoresist underlayer composition was coated on a template coupon using a spin coater and a spin rate of 1500 rpm+/−200 rpm. The target film thickness was 100 nm after curing, and the composition dilution was adjusted accordingly to give approximately the target film thickness after curing. The films were cured by placing the wafer on a hot plate at the conditions listen in Table 3. Planarization was evaluated with a KLA Tencor P-7 stylus profilometer to measure film height transition from an isolated step to an open trench, recording the maximum absolute value for the slope of this transition. Smaller numbers indicate a more gradual transition and therefore improved planarization.

TABLE 3

| PL Evaluation | | | |
|---|---|---|---|
| Underlayer film | Cure Conditions | Strip Resistance | Planarization (max slope absolute value) |
| Example 1 | 240° C./60 s | 99.8% | 87 |
| Example 2 | 350° C./60 s | 99.4% | 118 |
| Example 3 | 240° C./60 s | 100.0% | 139 |
| Example 4 | 240° C./60 s | 99.9% | 108 |
| Example 5 | 240° C./60 s | 100.0% | 115 |
| Example 6 | 240° C./60 s | 100.0% | 108 |
| Comparative Example 1 | 350° C./60 s | 94.3% | 214 |
| Comparative Example 2 | 240° C./60 s | 100.0% | 270 |
| Comparative Example 3 | 240° C./60 s | 100.0% | 134 |
| Comparative Example 4 | 240° C./60 s | 100.0% | 133 |
| Comparative Example 5 | 240° C./60 s | 99.6% | 169 |

As indicated by the data of Table 3, Examples 1, 2, 4, 5 and 6 have improved planarization values compared to each of the comparative examples. Example 3 has improved planarization compared to comparative examples 1, 2, and 5.

The direct benefit of having aromatic disulfide linkages can be seen in the following:

Example 1 and Comparative Example 1 films have very similar structures except for a —S—S— linkage in Example 1 and a $—CH_2—CH_2—$ linkage in Comparative Example 1, however Example 1 exhibits a significant improvement in planarization from 87 to 214, respectively.

Example 2 and Comparative Example 2 films are each prepared with a polymer (4.2 parts), A-2 and B-1, respectively, and blended with in a solvent system of PGMEA (91.0)/GBL (4.8) pGMA, however, Example 3 exhibits a significant improvement in planarization, 118 vs 270, respectively.

Films of Examples 4 and 5, and Comparative Examples 3 and 4, are each prepared using the respective underlayer forming compositions of Table 2. In the absence of any additive, the film of Comparative Example 3 has a max slope value of 134, however by incorporating an amine or phenol based additive that contains a disulfide linkage the max slope value is shown to decrease to 115 (Example 4) and 108 (Example 5). Moreover, the addition of adding in an analogous amine additive that does not contain a disulfide linkage (Comparative Example 4) there is no or little improvement in planarization. Lastly, by replacing the benzoxazine Comparative Example 5 with the disulfide linkage of Example 6 shows an improvement in planarization from 169 to 108, respectively.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of forming a pattern, the method comprising:

providing a photoresist underlayer over a substrate;

forming a photoresist layer over the photoresist underlayer;

patterning the photoresist layer; and transferring a pattern from the patterned photoresist layer to the photoresist underlayer;

wherein the photoresist underlayer is formed from a composition comprising a solvent and a compound represented by Formula 1

Formula 1

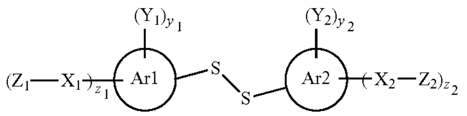

or a polymer having a repeating unit represented by Formula 2,

Formula 2

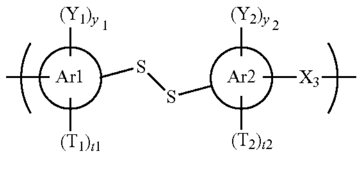

wherein Ar1 and Ar2 independently represent an aromatic group, in Formula 1, each $Y_1$ and each $Y_2$ are independently —OH, —SH, —$R^A$, —$OR^A$, and in Formula 2, each $Y_1$ and each $Y_2$ are independently —OH, —SH, —C(O)OH, —$NH_2$, —$R^A$, —$OR^A$, —C(O)$OR^A$, —$SR^A$, or —$NHR^A$, and $y_1$ and $y_2$ are independently an integer from 0 to 6;

$X_1$ and $X_2$ are independently a single bond or a divalent linker;

$X_3$ is a divalent linker;

$Z_1$ and $Z_2$ are independently —$OR^A$, —C(O)$OR^A$, —$SR^A$, —$NHR^A$, —OC(O)$CR^B$=$CH_2$, a substituted or unsubstituted $C_{1-18}$ alkyl group, a substituted or unsubstituted $C_{1-18}$ alkoxy group, a substituted or unsubstituted $C_{3-12}$ cycloalkyl group, a substituted or unsubstituted $C_{3-12}$ heterocycloalkyl group, a substituted or unsubstituted $C_{3-12}$ glycidyl group, a substituted or unsubstituted $C_{2-18}$ alkenyl group, a substituted or unsubstituted $C_{5-12}$ cycloalkenyl group, a substituted or unsubstituted $C_{3-18}$ alkynyl group, a substituted or unsubstituted $C_{6-14}$ aryl group, or a substituted or unsubstituted $C_{3-44}$ heteroaryl, $R^A$ is independently a substituted or unsubstituted $C_1$-$C_{18}$ alkyl, a substituted or unsubstituted $C_3$-$C_{12}$ cycloalkyl, a substituted or unsubstituted $C_3$-$C_{12}$ heterocycloalkyl, a substituted or unsubstituted $C_{2-18}$ alkenyl, a substituted or unsubstituted $C_{3-8}$ alkyne, a substituted or unsubstituted $C_6$-$C_{14}$ aryl, or a substituted or unsubstituted $C_6$-$C_{14}$ heteroaryl;

$R^B$ is hydrogen, fluorine, or a substituted or unsubstituted $C_{1-5}$ alkyl;

$T_1$ and $T_2$ are independently a divalent linker;

$z_1$ and $z_2$ are independently an integer from 0 to 6, and for the compound of Formula 1, $z_1+y_1$ is at least 1 and $z_2+y_2$ is at least 1; and $t_1$ and $t_2$ are independently an integer from 0 to 6.

2. The method of claim 1, wherein Ar1 and Ar2 are independently a substituted or unsubstituted phenyl, a substituted or unsubstituted naphthyl, a substituted or unsubstituted anthracenyl, a substituted or unsubstituted pyrenyl, a substituted or unsubstituted pyridinyl, a substituted or unsubstituted quinolinyl, a substituted or unsubstituted biphenyl, a substituted or unsubstituted fluorenyl, or a substituted or unsubstituted carbazoyl.

3. The method of claim 1, wherein the divalent linker $X_3$, $T_1$, and $T_2$ of Formula 2 are independently —O—, —S—, —C(O)—, or a group moiety of

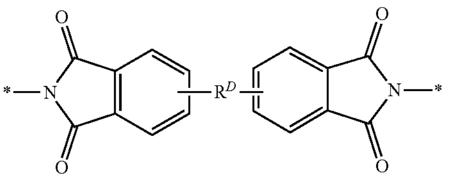

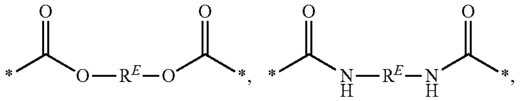

or $*—W—(Ar^4—(Z—Ar^5)_n—W^1)_m—*$, wherein $R^D$ is a single bond, or —C(O)—, —$S(O)_2$—, a substituted or unsubstituted $C_{1-6}$ alkylene, a substituted or unsubstituted $C_{3-14}$ cycloalkylene, a substituted or unsubstituted $C_{1-22}$ heteroalkylene, a substituted or unsubstituted $C_{6-24}$ arylene, or a substituted or unsubstituted $C_{3-24}$ heteroarylene, $R^E$ is a substituted or unsubstituted $C_{1-6}$ alkylene, a substituted or unsubstituted $C_{3-14}$ cycloalkylene, a substituted or unsubstituted $C_{1-22}$ heteroalkylene, a substituted or unsubstituted $C_{6-24}$ arylene, or a substituted or unsubstituted $C_{3-24}$ heteroarylene, W and $W^1$ are independently a substituted or unsubstituted $C_{1-4}$ alkylene, —O—, or a combination thereof;

$Ar^4$ and $Ar^5$ are independently a substituted or unsubstituted $C_{6-14}$ arylene, or a substituted or unsubstituted $C_{3-14}$ heteroarylene;

Z is absent, O, —S—, —C(O)—, a substituted or unsubstituted $C_{1-4}$ alkylene;

m is 0, 1, or 2; n is 0 or 1; and

* represents a point of attachment for the divalent linker.

4. The method of claim 1, wherein the photoresist underlayer composition further comprises a compound including an epoxy group or a polymer comprising an epoxy group.

5. The method of claim 1, wherein the photoresist underlayer composition further comprises:

a polymer derived from a monomer of Formula 4

Formula 4

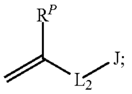

wherein $L_2$ is a divalent linking group;

J is a substituted or unsubstituted $C_1$-$C_{10}$ alkyl group with a hydroxy group or a glycidyl group, a substituted or unsubstituted $C_3$-$C_{10}$ cycloalkyl group with a hydroxy group or a glycidyl group, a substituted or unsubstituted $C_{6-24}$ aryl group with a hydroxy group or a glycidyl group, or a substituted or unsubstituted $C_{3-24}$ heteroaryl group with a hydroxy group or glycidyl group; and $R^P$ is hydrogen, fluorine, or an optionally substituted $C_{1-5}$ alkyl; or a polymer including a repeating unit represented by Formula 5;

Formula 5

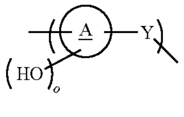

wherein in Formula 5

Ring A represents an aromatic group,

Y is a divalent linking group, and o is an integer from 1 to 8.

6. The method of claim 1, wherein the compounds of Formula 1 are represented by the following:
A1
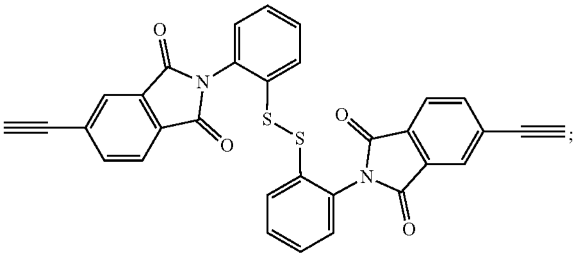
-continued
A4
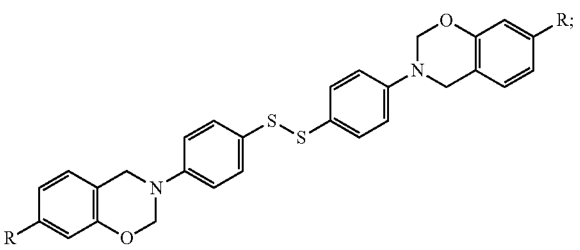
R:
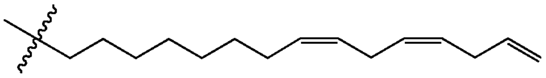
or
A6
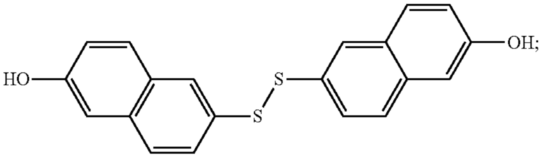
and
the polymers with the repeating unit of Formula 2 are represented as follows;
A2
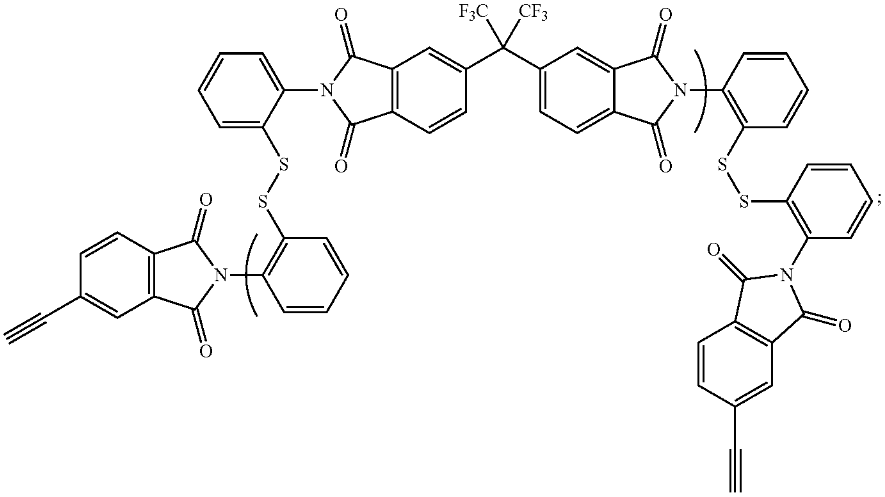

-continued

A3

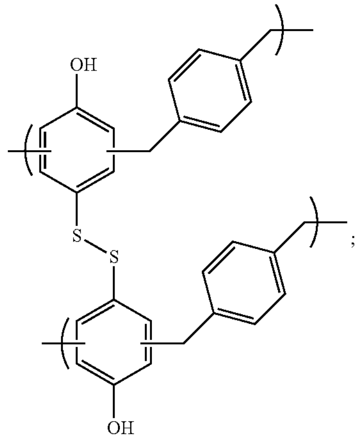

;

or $y_1$ and $y_2$ are independently 0, 1, 2, or 3 and $y_1+y_2$ is at least 1, each $Y_1$ and each $Y_2$ are independently —OH, —SH, —C(O)OH, 13 $NH_2$, $R^A$, —$OR^A$, —$C(O)OR^A$, —$SR^A$, or —$NHR^A$, and $R^A$ is independently a substituted or unsubstituted $C_1$-$C_6$ alkyl, a substituted or unsubstituted $C_3$-$C_6$ heterocycloalkyl, or a substituted or unsubstituted $C_6$-$C_{14}$ aryl; and $X_3$, $T_1$, and $T_2$ independently comprise an aromatic group with one to three aromatic rings, and/or $$*-W-(Ar^4-(Z-Ar^5)_n-W^1)_m-*$$

W and $W^1$ are independently a substituted or unsubstituted $C_{1-4}$ alkylene, —O—, or a combination thereof;

$Ar^4$ and $Ar^5$ are independently a substituted or unsubstituted $C_{6-14}$ arylene, or a substituted or unsubstituted $C_{3-14}$ heteroarylene;

Z is absent, O, —S—, —C(O)—, a substituted or unsubstituted $C_{1-4}$ alkylene;

m is 0, 1, or 2; n is 0 or 1; and

* represents a point of attachment for the divalent linker $t_1$ and $t_2$ are independently 0, 1, or 2.

7. A method of forming a pattern, the method comprising:

providing a photoresist underlayer over a substrate;

forming a photoresist layer over the photoresist underlayer;

patterning the photoresist layer; and transferring a pattern from the patterned photoresist layer to the photoresist underlayer;

wherein the photoresist underlayer is formed from a composition comprising a solvent and a compound represented by Formula 1

Formula 1

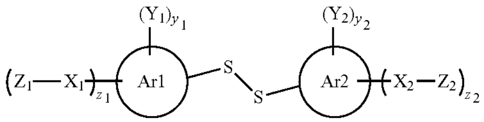

or or a polymer having a repeating unit represented by Formula 2,

Formula 2

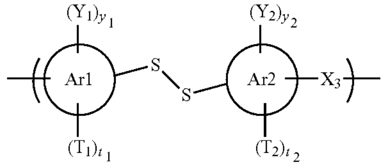

wherein Ar1 and Ar2 independently represent an aromatic group, in Formula 1, each $Y_1$ and each $Y_2$ are independently —OH, —SH, —$NH_2$, —$R^A$, —$OR^A$, and in Formula 2, each $Y_1$ and each $Y_2$ are independently —OH, —SH, —C(O)OH, —$NH_2$, —$R^A$, —$OR^A$, —$C(O)OR^A$, —$SR^A$, or —$NHR^A$, and $y_1$ and $y_2$ are independently an integer from 0 to 6;

$X_1$ and $X_2$ are independently a single bond or a divalent linker;

$X_3$ is a divalent linker;

$Z_1$ and $Z_2$ of Formula 1 are independently, represented by the following:

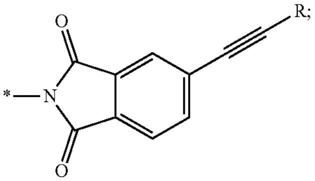

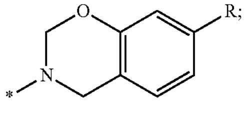

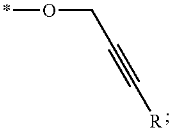

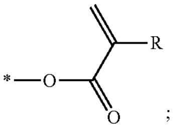

;

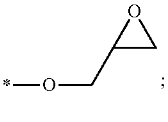

;

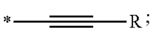

-continued

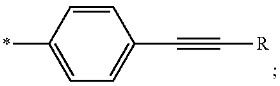

; or

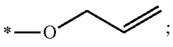

;

wherein in Formula 1,

* represents a point of attachment to $X_1$ or $X_2$, or if $X_1$ or $X_2$ is a single bond then a point of connection to a ring carbon of Ar1 or Ar2, respectively, and R is hydrogen, substituted or unsubstituted $C_{1-22}$ alkyl, substituted or unsubstituted $C_{3-14}$ cycloalkyl, substituted or unsubstituted $C_{1-22}$ heteroalkyl, substituted or unsubstituted $C_{2-14}$ heterocycloalkyl, substituted or unsubstituted $C_{6-24}$ aryl, or substituted or unsubstituted $C_{3-24}$ heteroaryl, and $Z_1$ and $Z_2$ in Formula 2 are independently —$OR^A$, —$C(O)OR^A$, —$SR^A$, —$NHR^A$, —$OC(O)CR^B{=}CH_2$, a substituted or unsubstituted $C_{1-18}$ alkyl group, a substituted or unsubstituted $C_{1-18}$ alkoxy group, a substituted or unsubstituted $C_{3-12}$ cycloalkyl group, a substituted or unsubstituted $C_{3-12}$ heterocycloalkyl group, a substituted or unsubstituted $C_{3-12}$ glycidyl group, a substituted or unsubstituted $C_{2-18}$ alkenyl group, a substituted or unsubstituted $C_{5-12}$ cycloalkenyl group, a substituted or unsubstituted $C_{3-18}$ alkynyl group, a substituted or unsubstituted $C_{6-14}$ aryl group, or a substituted or unsubstituted $C_{3-44}$ heteroaryl, where $R^A$ is independently a substituted or unsubstituted $C_1$-$C_{18}$ alkyl, a substituted or unsubstituted $C_3$-$C_{12}$ cycloalkyl, a substituted or unsubstituted $C_3$-$C_{12}$ heterocycloalkyl, a substituted or unsubstituted $C_{2-18}$ alkenyl, a substituted or unsubstituted $C_{3-8}$ alkyne, a substituted or unsubstituted $C_6$-$C_{14}$ aryl, or a substituted or unsubstituted $C_6$-$C_{14}$ heteroaryl; and where $R^B$ is hydrogen, fluorine, or a substituted or unsubstituted $C_{1-5}$ alkyl;

$T_1$ and $T_2$ are independently a divalent linker;

$z_1$ and $z_2$ are independently an integer from 0 to 6, and for the compound of Formula 1, $z_1+y_1$ is at least 1 and $z_2+y_2$ is at least 1; and $t_1$ and $t_2$ are independently an integer from 0 to 6.

8. A photoresist underlayer composition comprising a solvent and a compound represented by Formula 1

Formula 1

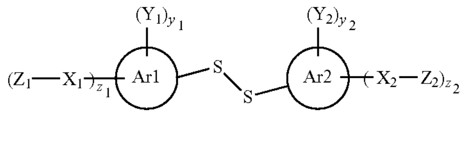

or a polymer having a repeating unit represented by Formula 2,

Formula 2

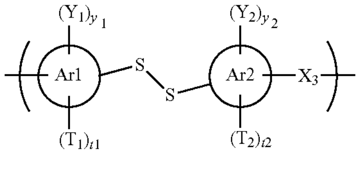

wherein:

Ar1 and Ar2 independently represent an aromatic group, in Formula 1, each $Y_1$ and each $Y_2$ are independently —SH, —$R^A$, —$OR^A$, and in Formula 2, each $Y_1$ and each $Y_2$ are independently —OH, —SH, —C(O)OH, —$NH_2$, —$R^A$, —$OR^A$, —$C(O)OR^A$, —$SR^A$, or —$NHR^A$, and $y_1$ and $y_2$ are independently an integer from 0 to 6;

$X_1$ and $X_2$ are independently a single bond or a divalent linker;

$X_3$ is a divalent linker;

$Z_1$ and $Z_2$ are independently —$OR^A$, —$C(O)OR^A$, —$SR^A$, —$NHR^A$, —$OC(O)CR^B{=}CH_2$, a substituted or unsubstituted $C_{1-18}$ alkyl group, a substituted or unsubstituted $C_{1-18}$ alkoxy group, a substituted or unsubstituted $C_{3-12}$ cycloalkyl group, a substituted or unsubstituted $C_{3-12}$ heterocycloalkyl group, a substituted or unsubstituted $C_{3-12}$ glycidyl group, a substituted or unsubstituted $C_{2-18}$ alkenyl group, a substituted or unsubstituted $C_{5-12}$ cycloalkenyl group, a substituted or unsubstituted $C_{3-18}$ alkynyl group, a substituted or unsubstituted $C_{6-14}$ aryl group, or a substituted or unsubstituted $C_{3-44}$ heteroaryl, where $R^A$ is independently a substituted or unsubstituted $C_1$-$C_{18}$ alkyl, a substituted or unsubstituted $C_3$-$C_{12}$ cycloalkyl, a substituted or unsubstituted $C_3$-$C_{12}$ heterocycloalkyl, a substituted or unsubstituted $C_{2-18}$ alkenyl, a substituted or unsubstituted $C_{3-8}$ alkyne, a substituted or unsubstituted $C_6$-$C_{14}$ aryl, or a substituted or unsubstituted $C_6$-$C_{14}$ heteroaryl;

where $R^B$ is hydrogen, fluorine, or a substituted or unsubstituted $C_{1-5}$ alkyl;

$T_1$ and $T_2$ are independently a divalent linker;

$z_1$ and $z_2$ are independently an integer from 0 to 6, and for the compound of Formula 1, $z_1+y_1$ is at least 1 and $z_2+y_2$ is at least 1; and $t_1$ and $t_2$ are independently an integer from 0 to 6, wherein the photoresist underlayer is free of photoacid generators.

9. The photoresist underlayer composition of claim 8, further comprising:

a polymer derived from a monomer of Formula 4

Formula 4

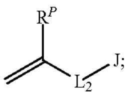

wherein $L_2$ is a divalent linking group;

J is a substituted or unsubstituted $C_1$-$C_{10}$ alkyl group with a hydroxy group or a glycidyl group, a substituted or unsubstituted $C_3$-$C_{10}$ cycloalkyl group with a hydroxy group or a glycidyl group, a substituted or unsubstituted $C_{6-24}$ aryl group with a hydroxy group or a glycidyl group, or a substituted or unsubstituted $C_{3-24}$ heteroaryl group with a hydroxy group or glycidyl group; and $R^P$ is hydrogen, fluorine, or an optionally substituted $C_{1-5}$ alkyl; or a polymer including a repeating unit represented by Formula 5;

Formula 5

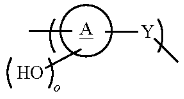

wherein in Formula 5

Ring A represents an aromatic group,

Y is a divalent linking group, and o is an integer from 1 to 8.

10. A photoresist underlayer composition comprising a solvent, a compound including an epoxy group or a polymer comprising an epoxy group, and a compound represented by Formula 1

Formula 1

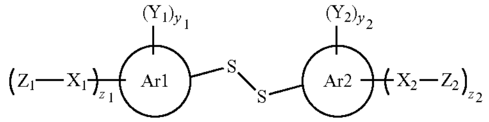

or a polymer having a repeating unit represented by Formula 2,

Formula 2

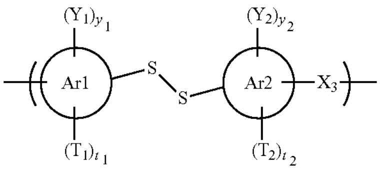

wherein:

Ar1 and Ar2 independently represent an aromatic group, in Formula 1, each $Y_1$ and each $Y_2$ are independently —SH, —$R^A$, —$OR^A$, and in Formula 2, each $Y_1$ and each $Y_2$ are independently —OH, —SH, —C(O)OH, —$NH_2$, —$R^A$, —$OR^A$, —$C(O)OR^A$, —$SR^A$, or —$NHR^A$, and $y_1$ and $y_2$ are independently an integer from 0 to 6;

$X_1$ and $X_2$ are independently a single bond or a divalent linker;

$X_3$ is a divalent linker;

$Z_1$ and $Z_2$ are independently —$OR^A$, —$C(O)OR^A$, —$SR^A$, —$NHR^A$, —$OC(O)CR^B{=}CH_2$, a substituted or unsubstituted $C_{1-18}$ alkyl group, a substituted or unsubstituted $C_{1-18}$ alkoxy group, a substituted or unsubstituted $C_{3-12}$ cycloalkyl group, a substituted or unsubstituted $C_{3-12}$ heterocycloalkyl group, a substituted or unsubstituted $C_{3-12}$ glycidyl group, a substituted or unsubstituted $C_{2-18}$ alkenyl group, a substituted or unsubstituted $C_{5-12}$ cycloalkenyl group, a substituted or unsubstituted $C_{3-18}$ alkynyl group, a substituted or unsubstituted $C_{6-14}$ aryl group, or a substituted or unsubstituted $C_{3-44}$ heteroaryl, where $R^A$ is independently a substituted or unsubstituted $C_1$-$C_{18}$ alkyl, a substituted or unsubstituted $C_3$-$C_{12}$ cycloalkyl, a substituted or unsubstituted $C_3$-$C_{12}$ heterocycloalkyl, a substituted or unsubstituted $C_{2-18}$ alkenyl, a substituted or unsubstituted $C_{3-8}$ alkyne, a substituted or unsubstituted $C_6$-$C_{14}$ aryl, or a substituted or unsubstituted $C_6$-$C_{14}$ heteroaryl;

where $R^B$ is hydrogen, fluorine, or a substituted or unsubstituted $C_{1-5}$ alkyl;

$T_1$ and $T_2$ are independently a divalent linker;

$z_1$ and $z_2$ are independently an integer from 0 to 6, and for the compound of Formula 1, $z_1+y_1$ is at least 1 and $z_2+y_2$ is at least 1; and $t_1$ and $t_2$ are independently an integer from 0 to 6.

* * * * *